(12) United States Patent
Pfister et al.

(10) Patent No.: US 10,693,500 B2
(45) Date of Patent: Jun. 23, 2020

(54) SYSTEMS AND METHODS FOR DECODING FORWARD ERROR CORRECTION CODES BASED ON COMPONENT CODES

(71) Applicant: Duke University, Durham, NC (US)

(72) Inventors: Henry Pfister, Durham, NC (US); Christian Haeger, Durham, NC (US)

(73) Assignee: Duke University, Durham, NC (US)

( * ) Notice: Subject to any disclaimer, the term of this patent is extended or adjusted under 35 U.S.C. 154(b) by 52 days.

(21) Appl. No.: 16/133,007

(22) Filed: Sep. 17, 2018

(65) Prior Publication Data

US 2019/0089379 A1 Mar. 21, 2019

Related U.S. Application Data

(60) Provisional application No. 62/559,002, filed on Sep. 15, 2017.

(51) Int. Cl.
*H03M 13/00* (2006.01)
*H03M 13/15* (2006.01)
*H03M 13/29* (2006.01)

(52) U.S. Cl.
CPC ..... *H03M 13/152* (2013.01); *H03M 13/2906* (2013.01); *H03M 13/2909* (2013.01); *H03M 13/2915* (2013.01); *H03M 13/2927* (2013.01); *H03M 13/155* (2013.01); *H03M 13/2948* (2013.01)

(58) Field of Classification Search
CPC ........... H03M 13/152; H03M 13/2915; H03M 13/2927; H03M 13/2906; H03M 13/2909; H03M 13/155; H03M 13/2948
See application file for complete search history.

(56) References Cited

U.S. PATENT DOCUMENTS

| | | | |
|---|---|---|---|
| 5,719,884 A | 2/1998 | Roth et al. | |
| 6,810,499 B2 | 10/2004 | Sridharan et al. | |
| 7,814,398 B2 | 10/2010 | Djurdjevic et al. | |
| 8,065,585 B1 | 11/2011 | Abbaszadeh et al. | |
| 8,276,047 B2 | 9/2012 | Coe | |
| 8,751,910 B2 | 6/2014 | Farhoodfar et al. | |
| 9,112,529 B1 | 8/2015 | Mazahreh et al. | |
| 2002/0049947 A1* | 4/2002 | Sridharan | H03M 13/152 714/752 |

OTHER PUBLICATIONS

Hager et al. Approaching Miscorrection-Free Performance of Product and Generalized Product codes, Nov. 21, 2017. Information Theory IEEE pp. 1-11.*

(Continued)

*Primary Examiner* — Samir W Rizk
(74) *Attorney, Agent, or Firm* — Michael Best & Friedrich LLP

(57) ABSTRACT

Methods and apparatus for the decoding of forward error correction codes. One method includes decoding a number of component codes including code symbols, for which at least one code symbol is involved in multiple component codes, and analyzing the decoding of each of the component codes to generate an outcome. Analyzing the decoding includes estimating at least one possible error location, storing information related to the at least one possible error location; storing state information, and updating the state information.

20 Claims, 11 Drawing Sheets

(56) References Cited

OTHER PUBLICATIONS

Condo et al., "Stall pattern avoidance in polynomial product codes," in Proc. IEEE Global Conf. Signal and Information Processing (GlobalSIP), Washington, DC (2016).
Condo et al., "A 9.96 dB NCG FEC scheme and 164 bits/cycle low-complexity product decoder architecture," IEEE Trans. Circuits and Systems I: Fundamental Theory and Applications (accepted for publication). [Online] Available: https://arxiv.org/pdf/1610.06050v2.pdf (2017).
Elias, "Error-free coding," IRE Trans. Inf. Theory, vol. 4, No. 4, pp. 29-37 (Apr. 1954).
Emmadi et al., "Half-product codes for flash memory," in Proc. Non-Volatile Memories Workshop, San Diego, CA (2015).
Felstrom et al., "Braided block codes," IEEE Trans. Inf. Theory, vol. 55, No. 6, pp. 2640-2658 (Jul. 2009).
Hager et al., "Density evolution for deterministic generalized product codes on the binary erasure channel at high rates," IEEE Trans. Inf. Theory, vol. 63, No. 7, pp. 4357-4378 (Jul. 2017).
Holzbaur et al., "Improved decoding and error floor analysis of staircase codes," in Proc. Int. Workshop on Coding and Cryptography (WCC), Saint Petersburg, Russia (2017).
Jian et al., "Iterative hard-decision decoding of braided BCH codes for high-speed optical communication," in Proc. IEEE Glob. Communication Conf. (GLOBECOM), Atlanta, GA (2013).
Jian et al., "Approaching capacity at high-rates with iterative hard-decision decoding," IEEE Trans. Inf. Theory, vol. 63, No. 9, pp. 5752-5773 (Sep. 2017).
Justesen et al., "Analysis of iterated hard decision decoding of product codes with Reed-Solomon component codes," in Proc. IEEE Information Theory Workshop (ITW), Tahoe City, CA (2007).
Justesen et al., "Error correcting coding for OTN," IEEE Commun. Mag., vol. 59, No. 9, pp. 70-75 (Sep. 2010).
Justesen et al., "Performance of product codes and related structures with iterated decoding," IEEE Trans. Commun., vol. 59, No. 2, pp. 407-415 (Feb. 2011).
Mittelholzer et al., "Improving the error-floor performance of binary half-product codes," in Proc. Int. Symp. Information Theory and its Applications (ISITA), Montenery, CA (2016).
Pfister et al., "Symmetric product codes," in Proc. Information Theory and Applications Workshop (ITA), San Diego, CA (2015).
Schwartz et al. "On the asymptotic performance of iterative decoders for product codes," in Proc. IEEE Int. Symp. Information Theory (ISIT), Adelaide, SA (2005).
Smith et al., "Staircase codes: FEC for 100 Gb/s OTN," J. Lightw. Technol., vol. 30, No. 1, pp. 110-117 (Jan. 2012).
Zhang et al., "Spatially-coupled split-component codes with bounded-distance component decoding," in Proc. IEEE Int. Symp. Information Theory (ISIT), Hong Kong (2015).

\* cited by examiner

SYSTEMS AND METHODS FOR DECODING FORWARD ERROR CORRECTION CODES BASED ON COMPONENT CODES

CROSS-REFERENCE TO RELATED APPLICATIONS

This application claims priority from U.S. Provisional Patent Application No. 62/559,002 filed Sep. 15, 2017, the contents of which are incorporated herein by reference.

FIELD

The present invention relates to error detection and correction of component-based codes and generalized product codes in communication systems.

SUMMARY

In the transmission of information-bearing signals over communication channels, errors often arise in the data due to noise, or other interference, in the communication channels. These errors have been attempted to be corrected using various methods, such as forward error correction (FEC). FEC attempts to correct the errors by using an encoder to map the underlying data in the signals to code symbols. The corrupted signal is received by a decoder, which attempts to reconstruct the code symbols in order to recover the underlying data.

The number of errors that can be corrected by an FEC system is dependent on the structure of the code used. As such, various types of FEC codes have been proposed over time. One particular class of FEC codes, called component-based codes, comprise multiple ordered subsets of the code symbols (e.g. bits) that are themselves code-words of smaller component codes. These component-based codes include, but are not limited to, product codes, generalized product codes (GPCs), higher-dimensional product codes, half-product codes, and convolutional versions thereof which are commonly decoded by windowed decoding (e.g. staircase codes, braided codes, half-braided codes, or continuously-interleaved codes). Component-based codes can be decoded through an iterative process of decoding the individual component codes (e.g., using bounded-distance decoding (BDD)), and the process is generally effective at detecting and correcting noise-related errors.

However, in current systems, the decoder may occasionally miscorrect one or more code symbols. That is, the decoder outputs a valid sequence of a code symbol which is, however, not the transmitted code symbol. One way to mitigate this problem is to use a method of extrinsic message-passing. Extrinsic message-passing shows improvement over iterative BDD, at least in regards to avoiding miscorrections, but extrinsic message-passing can suffer from heightened data flow and storage requirements. Moreover, an idealized process of BDD, in which all miscorrections are avoided entirely, is more effective than the extrinsic method. Therefore, there is need for an improved process of iterative BDD that better detects and avoids instances of miscorrection.

SUMMARY

The present disclosure relates, in part, to systems and methods for avoiding miscorrection during the decoding of component-based codes, such as generalized product codes (GPCs).

One aspect of the present disclosure provides a method of decoding forward error correction codes, the method includes decoding a number of component codes, wherein the number of component codes include code symbols, for which at least one code symbol is involved in multiple component codes. The method further includes analyzing the decoding of each of the number of component codes to generate an outcome. The analyzing of each of the number of component codes includes: estimating at least one possible error location; storing information related to the outcome; storing state information; and updating the state information based on the information related to the outcome and based on a previous version of the state information.

Another aspect of the present disclosure provides a method of windowed decoding, the method includes decoding a number of component codes within a specified window, and analyzing the decoding of each of the number of component codes to generate an outcome. The step of analyzing each of the number of component codes includes estimating at least one possible error location and storing information related to the at least one possible error location. The step of analyzing each of the number of component codes further includes storing state information, and updating the state information based on the information related to the outcome and based on a previous version of the state information and where the updating rules depend on the bit position of the component codes in the window.

In some embodiments of the above method, the step of decoding the number of component codes is performed by a component code decoder. The component code decoder is configured to output the information related to the at least one possible error location or else indicating a failure to decode. In another embodiment of the above method, the component code decoder is a soft decision decoder. In another embodiment of the above method, the component code decoder is a hard decision decoder. In still another embodiment of the above method, the component code decoder is a bounded-distance decoder.

In some embodiments, the state information for a component code includes a syndrome of a number of symbol estimates. In another embodiment, the state information for a component code includes a value indicating whether the component code is reliable. In other embodiments, the state information for a component code comprises an array of corrected error locations that have been corrected by the component code. In still other embodiments, updating the state information further includes using the information related to the outcome to change at least one symbol estimate and revert at least one previous change. In other embodiments, the updating of the state information further includes preventing a correction of at least one estimated error that coincides with a reliable code. In a still further embodiment, the updating of the state information further includes tracking a quantity of estimated miscorrections that coincide with a particular code, and if the quantity of estimated errors exceeds a threshold value, reverting the at least one previous change that coincides with the particular code, and marking the particular code as unreliable.

In another embodiment, the above decoding methods stop decoding when an established termination condition is satisfied. In other embodiments, the methods further include a post-processing step of correcting at least one remaining error. In further embodiments, the correcting of at least one remaining error includes: marking a set of component codes as unreliable based on the state information; locating at least one intersection point among the set of component codes marked as unreliable; changing the code symbols located at each of the at least one intersection points; and resuming the step of decoding the number of component codes. In yet another embodiment, the correcting the at least one remaining error includes marking a set of component codes as unreliable based on the state information, and using a specialized decoder to decode the set of component codes marked as unreliable.

Another aspect of the present disclosure discloses an apparatus for decoding forward error correction codes. The apparatus includes a memory and at least one processor coupled to the memory. The at least one processor is configured to decode a number of component codes, wherein the number of component codes include code symbols, for which at least one subset of code symbols is a code-word of a component code, and analyze the decoding of each of the number of component codes to generate an outcome. Analyzing each of the number of component codes includes: estimating at least one possible error location; storing information related to the at least one possible error location; storing state information; and updating the state information based on the information related to the outcome and based on a previous version of the state information.

Other aspects of the invention will become apparent by consideration of the detailed description and accompanying drawings.

DETAILED DESCRIPTION

Figure 1:
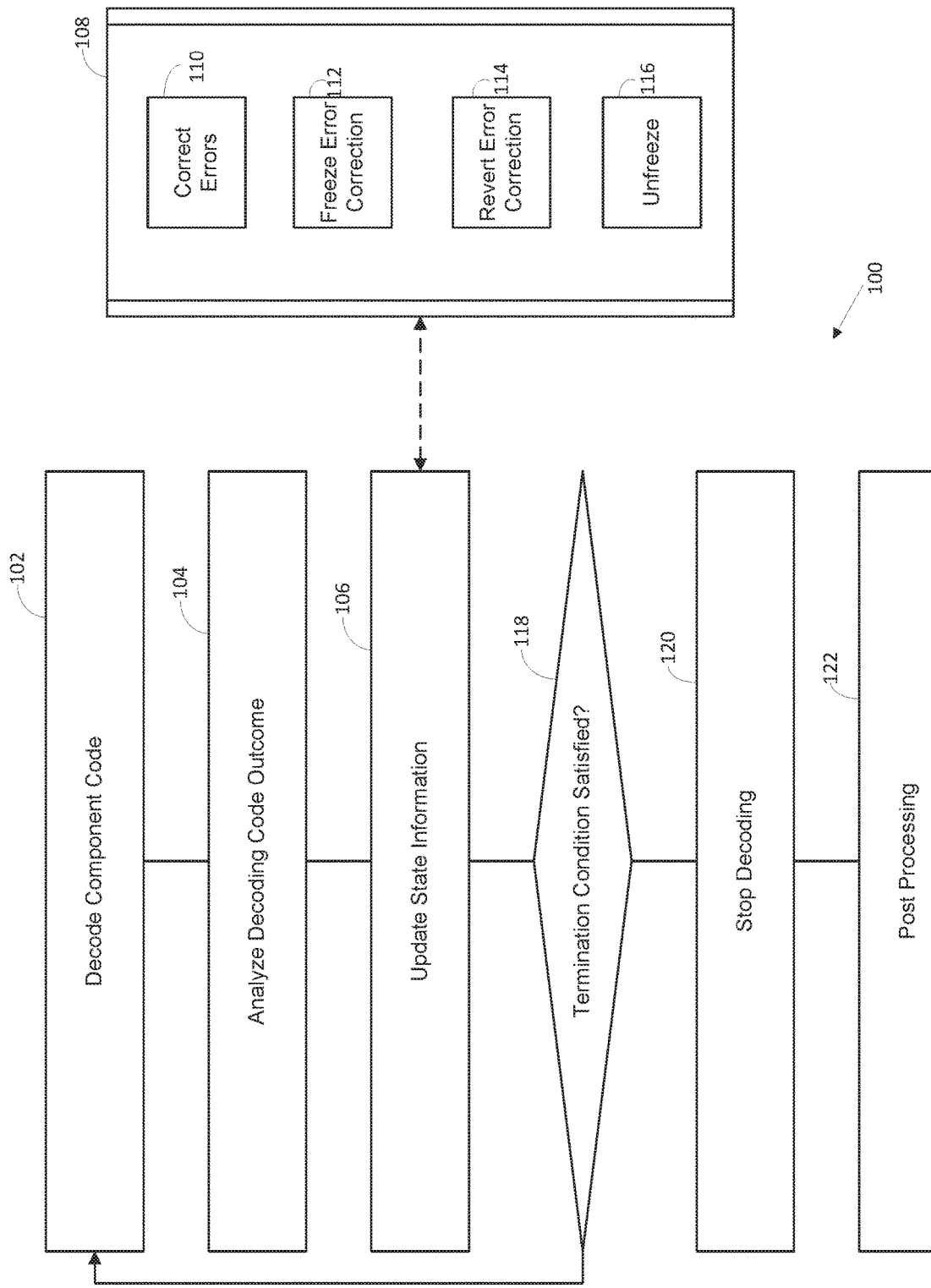
FIG. 1 is a flow chart illustrating a process of decoding forward error correction codes, according to some embodiments.

One or more embodiments are described and illustrated in the following description and accompanying drawings. These embodiments are not limited to the specific details provided herein and may be modified in various ways. Furthermore, other embodiments may exist that are not described herein. Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way, but may also be configured in ways that are not listed. Furthermore, some embodiments described herein may include one or more electronic processors configured to perform the described functionality by executing instructions stored in non-transitory, computer-readable medium. Similarly, embodiments described herein may be implemented as non-transitory, computer-readable medium storing instructions executable by one or more electronic processors to perform the described functionality. As used in the present application, "non-transitory computer-readable medium" comprises all computer-readable media but does not consist of a transitory, propagating signal. Accordingly, non-transitory computer-readable medium may include, for example, a hard disk, a CD-ROM, an optical storage device, a magnetic storage device, a ROM (Read Only Memory), a RAM (Random Access Memory), register memory, a processor cache, or any combination thereof.

In addition, the phraseology and terminology used herein is for the purpose of description and should not be regarded as limiting. For example, the use of "including," "containing," "comprising," "having," and variations thereof herein is meant to encompass the items listed thereafter and equivalents thereof as well as additional items. The terms "connected" and "coupled" are used broadly and encompass both direct and indirect connecting and coupling. Further, "connected" and "coupled" are not restricted to physical or mechanical connections or couplings and can include electrical connections or couplings, whether direct or indirect. In addition, electronic communications and notifications may be performed using wired connections, wireless connections, or a combination thereof and may be transmitted directly or through one or more intermediary devices over various types of networks, communication channels, and connections. Moreover, relational terms such as first and second, top and bottom, and the like may be used herein solely to distinguish one entity or action from another entity or action without necessarily requiring or implying any actual such relationship or order between such entities or actions. Articles "a" and "an" are used herein to refer to one or to more than one (at least one) of the grammatical object of the article. By way of example, "an element" means at least one element and can include more than one element. Unless otherwise defined, all technical terms used herein have the same meaning as commonly understood by one of ordinary skill in the art to which this disclosure belongs.

Embodiments are described herein with reference to flowchart illustrations and/or block diagrams and/or figures. The flowchart, block diagrams and other illustrations in the present disclosure illustrate the architecture, functionality, and operation of possible implementations of systems, methods, computer program products (non-transitory computer-readable medium storing instructions executable one electronic processors, such as a microprocessor, to perform a set of functions), and the like according to various embodiments of the present invention. In this regard, each block in the flowchart or block diagrams, or accompanying figures herein may represent a module, segment, or portion of instructions, which comprises one or more executable instructions for implementing the specified logical function(s). In some alternative implementations, the functions noted in the block or figures may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration and/or figures and combinations of blocks in the block diagrams and/or flowchart illustration and/or figures can be implemented by special purpose hardware-based systems that perform the specified functions or acts or carry out combinations of special purpose hardware and computer instructions.

The present disclosure provides, in part, an improved decoder for a class of forward error correction codes, such as GPCs, where a code-word of a GPC comprises a sequence of code symbols (e.g., bits) such that many ordered subsets of the code symbols also form code-words of similar component codes. Other types of forward error correction codes can include product codes, higher-dimensional product codes, etc. The systems and methods described herein avoid most miscorrections and backtracks miscorrections that are not avoided. The present disclosure may be a system, a method, and/or apparatus/medium (e.g., a computer program product, device, etc.). Examples of computer program products may include a computer readable storage medium (or media) having computer readable program instructions thereon for causing a processor to carry out aspects of the present disclosure.

One aspect of the present disclosure provides a process 100 of decoding forward error correction codes. As shown in FIG. 1 and in greater detail in Example 1 below, the process first decodes a number of component codes at process block 102. In one example, the process may be performed using a component code decoder, such as those described below. In some examples, the component codes may be code symbols, for which at least one subset of code symbols is a code-word of an individual component code. In decoding the component codes, the process 100 determines information related to an estimated location of one or more errors within the component codes. If the process cannot determine the information related to the estimated location of the one or more errors within the component code, the process may stop the decoding process indicate a failure to decode. In certain embodiments, the component code decoder is a hard decision decoder to decode the component code.

Examples of suitable component codes include, but are not limited to, block codes, such as Reed-Solomon, Golay, BCH, Multidimensional-parity, and Hamming Codes. Examples of suitable component decoders include, but are not limited to, syndrome, algebraic, Berlekamp-Massey, Viterbi, MAP, BCJR, iterative, and belief-propagation. Examples of suitable post-processing methods include, but are not limited to, bit-flip-and-iterate, algebraic-erasure decoding, algebraic-errors-and-erasures decoding, and MAP-erasures decoding.

Once the component codes have been decoded, an outcome is generated for each of the decoded component codes. At process block 104, outcomes are analyzed. In one embodiment, analyzing the decoded component code outcomes includes: (i) estimating at least one possible error location; (ii) storing information related to the at least one possible error location; and (iii) storing state information. The state information may include one or more of the following: separate bit reliability information for each bit of the decoded component code; a syndrome of the current symbol estimates for each component code-word; a value indicating whether the decoded component code is reliable; and/or the locations of the errors that have been previously corrected within the component code. In some embodiments, the locations of errors already corrected may be stored in an array.

At process block 106, the state information is updated. In one embodiment, the state information is updated based on the outcome generated at process block 104 and a previous version of the state information. The state information may be updated several ways. As shown in FIG. 1, sub-process 108 can include multiple processes updating the state information. In one embodiment, the state information may be updated by using the error location information from the decoder to change the current symbol estimates for the component code (e.g., to correct errors) at sub-process block 110. In another embodiment, the state information may be updated by using the determined error location information from the decoding process 102 to revert previously made error corrections at sub-process block 114. In yet another embodiment, the state information is updated by preventing (e.g., freezing) the correction of estimated errors that conflict with previously decoded code symbols which have been marked as reliable (e.g., anchor sequences) at process block 112. In still further embodiments, the state information may be updated by tracking the number of conflicts between frozen error corrections and previously decoded symbols that are marked as reliable, reverting the correction of and marking as unreliable previously decoded code symbols that contain too many conflicts with frozen error corrections with sub-process 114 and then unfreeze the codes with sub-process 116. In some embodiments, the sub-processes 110, 112, 114, 116 may be applied individually or in combination to update the state information at process block 106.

Once the state information has been updated at process block 106, the process 100 determines if a termination condition has been satisfied at process block 118. If the termination conditions have not been met, the process 100 returns to process block 102 to continue decoding the component codes. If the termination conditions have been met, the process stops decoding at process block 120. The threshold is subjective and is based on the goals of the error correction process and therefore can be determined by one skilled in the art. For example, a suitable threshold may be that no one component code includes more than a specified number of errors (e.g., one, four, etc.); include an iteration limit, etc.

It is important to point out that the process described in FIG. 1 may be performed in parallel (e.g., multiple component code decoding processes running at the same time); in series (e.g., a decoding process run one at a time); or in a hybrid fashion, where some decoding processes are run in parallel and others in series.

After the component codes have been decoded, post processing may be initiated at process block 122. Post-processing methods may be performed after the decoding methods provided herein are completed to help improve performance. Numerous post-processing methods have been described and are well-known to those skilled in the art, all of which are within the scope of the present disclosure.

Figure 2:
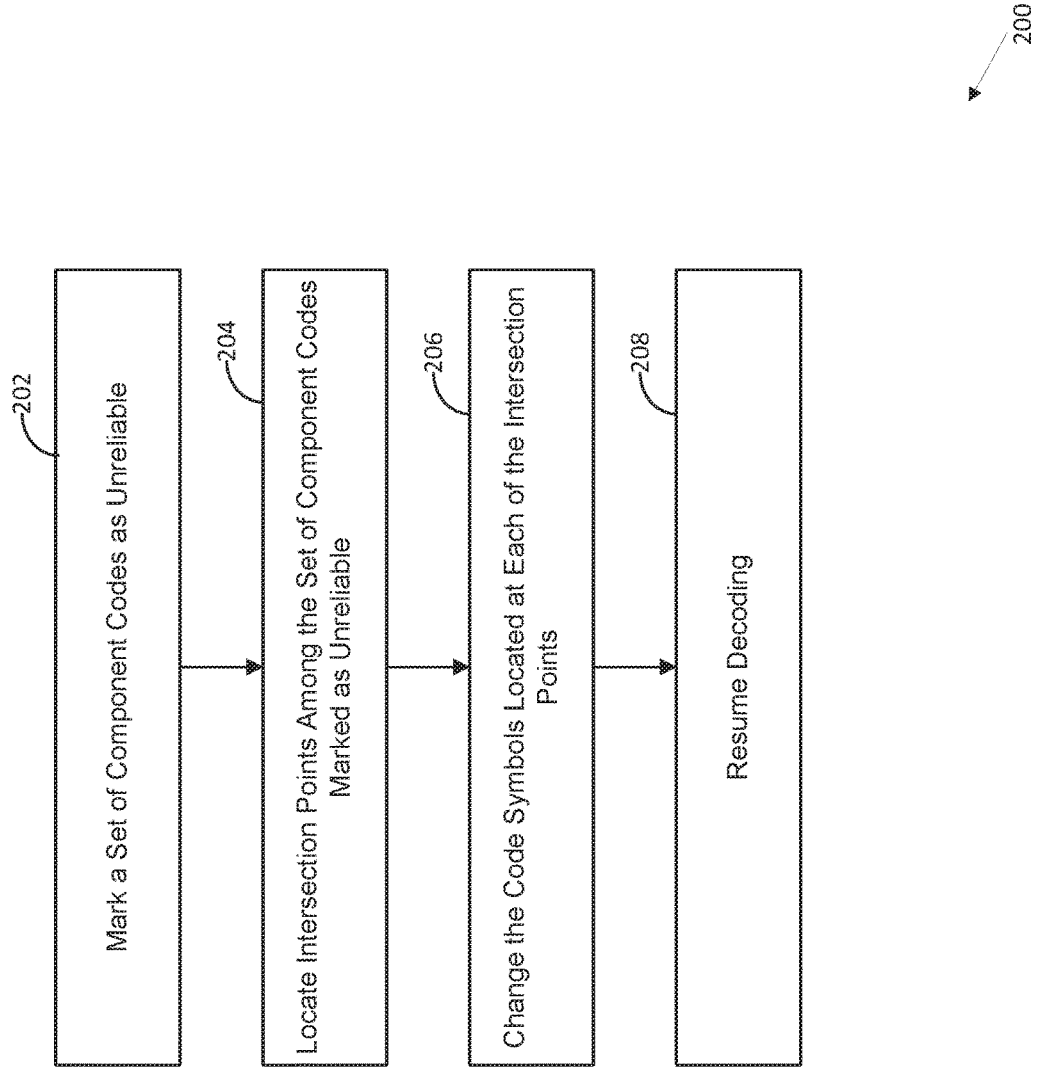
FIG. 2 is a flow chart illustrating a post-processing process, according to some embodiments.

Turning now to FIG. 2, a flow chart illustrating an embodiment of a post-processing process 200 is shown. The post-processing process 200 may be configured to attempt to correct at least one remaining error within a given component code. At process block 202, a set of component codes may be marked as unreliable based on determined state information. At process block 204, at least one intersection point among the set of component codes marked as unreliable is located. At process block 206, the code symbols located at each of the located intersection points are changed. Finally, at process block 208, the component codes may again be decoded. In certain embodiments, the post-processing includes marking a set of component codes as unreliable based on the state information; and using a specialized decoder to decode the set of component codes marked as unreliable.

Windowed Decoding

Figure 3:
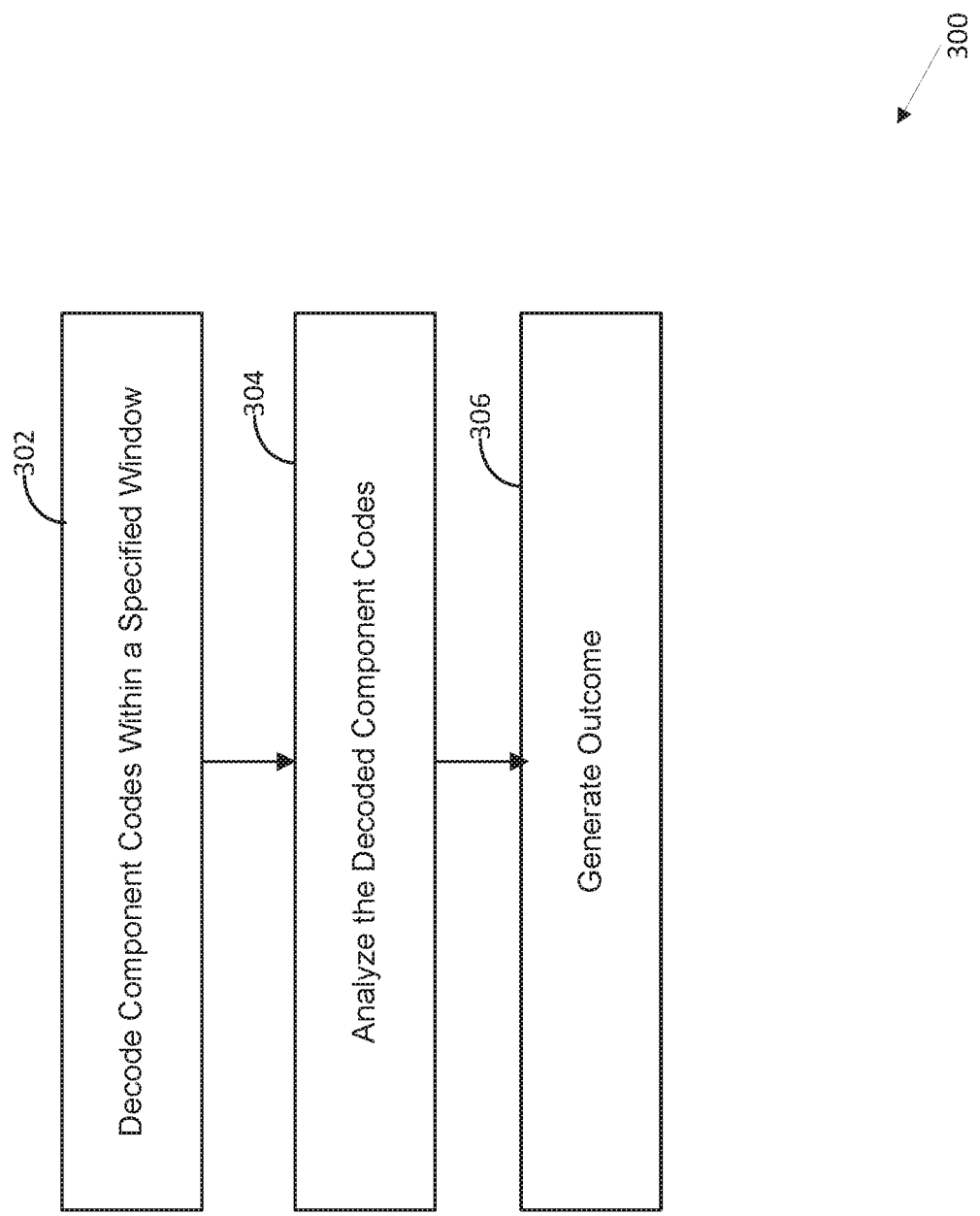
FIG. 3 is flow chart illustrating a process for windowed decoding, according to some embodiments

The systems and methods provided herein can further be applied to windowed decoding as commonly employed to decode, e.g. staircase codes, braided codes, half-braided codes, or continuously-interleaved codes. Similar to classical product codes, staircase codes are built from short component codes and decoded by iteratively applying bounded-distance decoding (BDD) to the component codes. As used herein. the term "anchor code" refers to those component codes that are determined to include all correct symbols during (and after) the decoding process. Turning to FIG. 3, a process 300 for windowed decoding is illustrated. At process block 302, a number of component codes within a specified window are decoded. At process block 304 the decoded component codes are analyzed, and an outcome is generated at process block 306. In one embodiment, analyzing the decoded component codes includes: estimating at least one possible error location; storing information related to the at least one possible error location; storing state information; and, updating the state information based on the generated outcome and a previous version of the state information. In one embodiment, the updating of the state information depends on the bit position of the component codes in the specified window. A more detailed example of a windowed decoding process can be found in Example 2.

Figure 4:
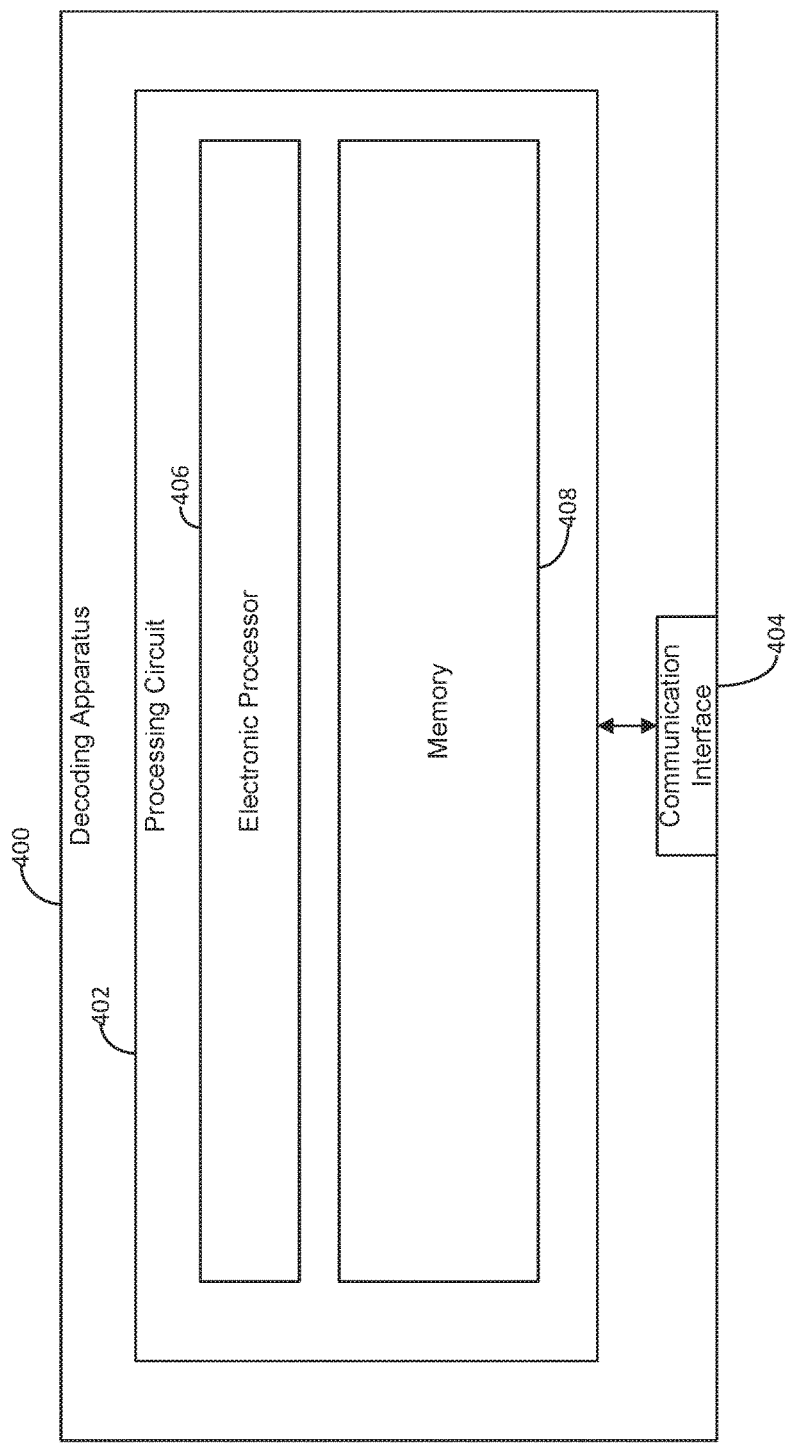
FIG. 4 is a block diagram of an apparatus for decoding forward error correction codes, according to some embodiments.

Turning now to FIG. 4, a block diagram illustrating a decoding apparatus 400 for decoding forward error correction codes is shown. The decoding apparatus includes a processing circuit 402 and a communication interface 404. The communication interface 404 may configured to facilitate communications between the processing circuit 402 and one or more external devices and/or networks. The communication interface 404 can be or include wired or wireless communications interfaces (e.g., jacks, antennas, transmitters, receivers, transceivers, wire terminals, etc.) for conducting data communications between the decoding apparatus 200 and one or more external devices. In some embodiments, the communication interface 404 is a wireless communication interface such as cellular (3G, 4G, LTE, CDMA, 5G, etc.), Wi-Fi, Wi-MAX, ZigBee, ZigBee Pro, Bluetooth, Bluetooth Low Energy (BLE), RF, LoRa, LoRaWAN, Near Field Communication (NFC), Radio Frequency Identification (RFID), Z-Wave, 6LoWPAN, Thread, WiFi-ah, and/or other wireless communication protocols. Additionally, the communication interface 404 may include wired interfaces such as Universal Serial Bus (USB), USB-C, Firewire, Lightning, CAT5, universal asynchronous receiver/transmitter (UART), serial (RS-232, RS-485), etc.

In one embodiment, the processing circuit 402 is communicably connected to the communication interface 404. The processing circuit 402 includes one or more electronic processors 406 and a memory 408. The electronic processor 406 may be implemented as a programmed microprocessor, an application specific integrated circuit (ASIC), one or more field programmable gate arrays (FPGA), a group of processing components, or other suitable electronic processing components.

The memory 408 (e.g. memory, memory unit, storage device, etc.) may include one or more devices (e.g., RAM, ROM, Flash memory, hard disk storage, etc.) for storing data and/or computer code for completing or facilitating the various processes, layers and modules described herein. Memory 408 can be or include volatile memory or non-volatile memory. Memory 408 can include database components, object code components, script components, or any other type of information structure for supporting the various activities and information structure described in the present application. According to one example, the memory 408 is communicably coupled to the electronic processor 406 via the processing circuit 402, and can include computer code for executing (e.g., by the processing circuit 402 and/or the electronic processor 406), one or more processes described herein. For example, the memory 408 and the at least one electronic processor 406 can be configured to: (i) decoding a number of component codes, the number of component codes including code symbols, for which at least one subset of code symbols is a code-word of a component code; and (ii) analyzing the decoding of each of the component codes to generate an outcome. Analyzing each of the component codes can include: (i) estimating at least one possible error location; (ii) storing information related to the at least one possible error location; (iii) storing state information; and (iv) updating the state information based on the information related to the outcome and based on a previous version of the state information.

Yet another aspect of the present disclosure provides for a non-transitory processor-readable medium for decoding forward error correction codes, the non-transitory processor-readable medium configured to cause at least one processor to perform the steps comprising of, consisting of, or consisting essentially of: (i) decoding a plurality of component codes, the plurality of component codes comprising code symbols, for which at least one subset of code symbols is a code-word of a component code; and (ii) analyzing the decoding of each of the plurality of component codes to generate an outcome, the step of analyzing each of the plurality of component codes comprising: (i) estimating at least one possible error location; (ii) storing information related to the at least one possible error location; (iii) storing state information; and (iv) updating the state information based on the information related to the outcome and based on a previous version of the state information.

The following examples are provided by way of illustration and not by way of limitation. Although the invention has been described in detail with reference to certain preferred embodiments, variations and modifications exist within the scope and spirit of one or more independent aspects of the invention as described. Various features and advantages of the invention are set forth in the following claims.

Example 1—Method for Decoding Forward Error Correction Based on Component Codes

Product Codes and Iterative Decoding
Simple Product Codes ("PC")

Let $H \in \mathbb{F}_2^{(n-k) \times n}$ be the parity-check matrix of a binary linear (n, k $d_{min}$) code $\mathbb{F}$, where n, k, and $d_{min}$ are the code length, dimension, and minimum distance, respectively. A simple PC based on $\mathbb{F}$ is defined as:

$$\mathcal{P}(\mathcal{C}) \triangleq \{X \in \mathbb{F}_2^{n \times n} | HX = O, XH^T = O\} \quad \text{Equation 1}$$

Simple PC's are used for illustration purposes in one embodiment of the invention.

The code-words X can be represented as two-dimensional arrays. The two conditions in (1) enforce that the rows and columns in the array are valid code-words in $\mathcal{C}$. In the following, we use a pair (i, j) to identify a particular component code-word. The first parameter i∈{1, 2} refers to the code-word type which can be either a row (i=1) or a column (i=2). The second parameter j∈[n] enumerates the code-words of a given type.

Example 1

Figure 5:
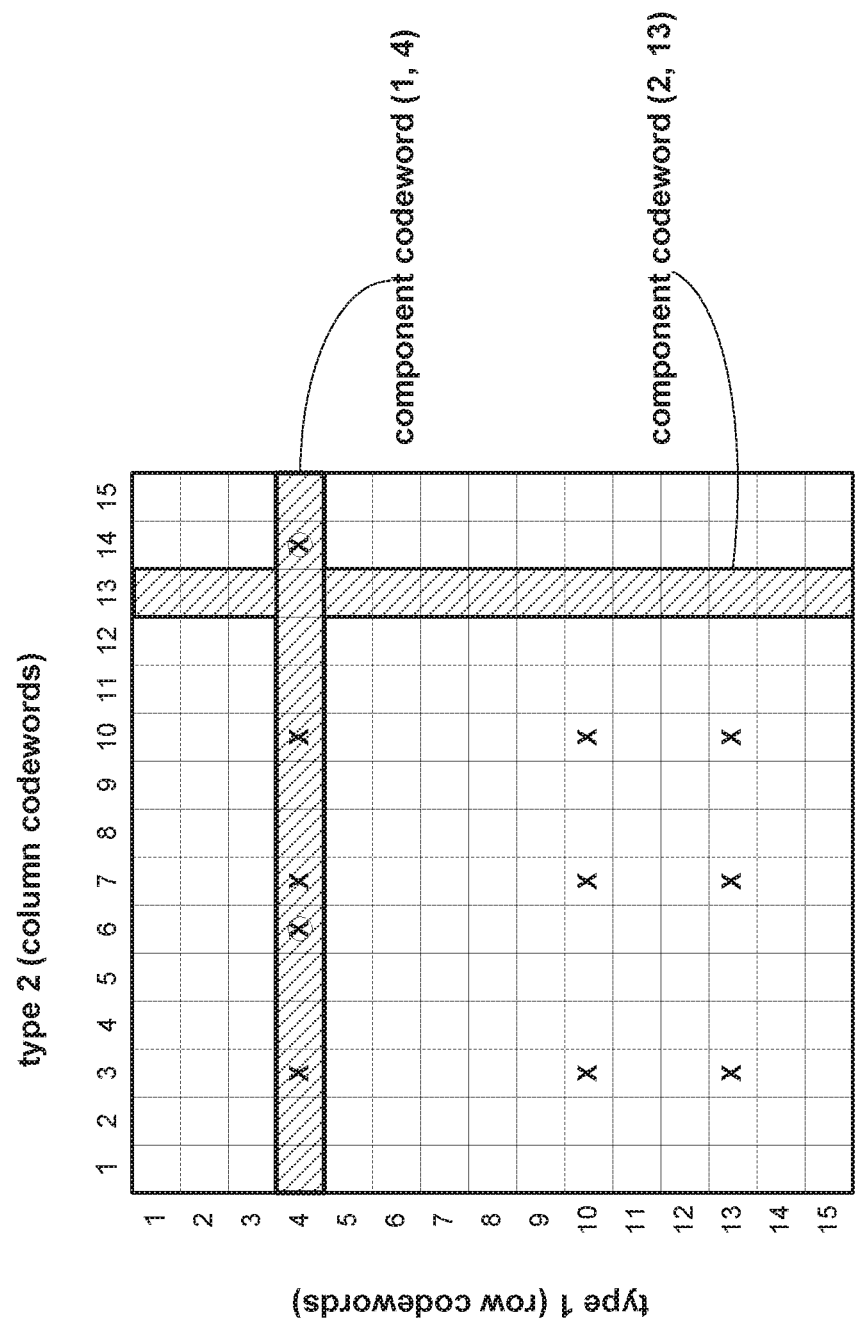
FIG. 5 is an example code array for a product code where the component codes have a length of n=15, according to some embodiments.

The code array for a PC where the component code has length n=15 is shown in FIG. 5. The component code-words (1, 4) and (2, 13) are highlighted.

For PCs, the individual bits can be identified by their two coordinates within the PC array. However, this way of specifying bits does not generalize well to other code classes because the associated code array may have a different shape or there may not exist an array representation at all. Therefore, in order to keep the notation general we use the convention that a particular bit is specified by two component code-words (i, j) and (k, l), i.e., four parameters (i, j, k, l) in total.

Example 2

The two highlighted component code-words in FIG. 5 intersect at the bit corresponding to the tuple (1, 4, 2, 13) or (2, 13, 1, 4).

BCH Component Codes

In one embodiment, we use binary t-error-correcting BCH codes as component codes, as well as their extended versions. An extended BCH code is obtained through an additional parity bit, formed by adding (modulo 2) all coded bits $c_1, c_2, \ldots, c_{2\nu-1}$ of the BCH code, where $\nu$ is the Galois field extension degree. The overall component code has length $n=2^\nu - 1 + e$, where $e \in \{0, 1\}$ indicates if the code extension is used. The guaranteed code dimension is $k = 2^\nu - 1 - \nu t$. For e=0, the guaranteed minimum distance is $d_{min}=2t+1$. This is increased to $d_{min}=2t+2$ for e=1. We use a triple ($\nu$, t, e) to denote all BCH code parameters.

As an alternative to extending the code, one may also employ certain subcodes of the original BCH code. For example, the singly-extended BCH code behaves similarly to the even-weight subcode of a BCH code.

Bounded-Distance Decoding and Miscorrections

In one embodiment, we use bounded-distance decoding (BDD) to decode the BCH component codes. However, the description may be modified to account for other decoding algorithms as well.

Consider the transmission of a (component) code-word $c \in \mathcal{C}$ over the binary symmetric channel (BSC) with crossover probability p. The error vector introduced by the channel is denoted by n, i.e., the components of n are i.i.d. Bernoulli(p) random variables. Applying BDD to the received vector r=c+n results in $$BDD(r) = \begin{cases} c & \text{if } d_H(r, c) = w_H(n) \le t, \\ c' \in C & \text{if } w_H(n) > t \text{ and } d_H(r, c') \le t, \\ \text{FAIL} & \text{otherwise.} \end{cases} \quad \text{Equation 2}$$

In practice, BDD is implemented by first computing the syndrome $s^T = H n^T \in \mathbb{F}_2^{n-k}$. Each of the $2^{n-k}$ possible syndromes is then associated with either an estimated error vector n where $w_H(n) \le t$, or a decoding failure. In the first case, the decoded output is computed as $r+\hat{n}$.

The second case in (2) corresponds to an undetected component code error or miscorrection.

Example 3

Consider the component code-word (1, 4) in FIG. 5 and assume that the all-zero code-word c=0 is transmitted. The black crosses represent bit positions which are received in error, i.e., $n_i=1$ for $i \in \{3, 7, 10\}$ and $n_i=0$ elsewhere. For a component code with t=2 and e=0, we have $d_{min}=2t+1=5$, i.e., there exists at least one code-word $c' \in \mathcal{C}$ with Hamming weight 5. Assume we have $c' \in \mathcal{C}$ with c'i=1 for $i \in \{3, 6, 7, 10, 14\}$ and c'i=0 elsewhere. Applying BDD to r=c+n then introduces two additional errors at bit positions 6 and 14, as shown by the red crosses in FIG. 1.

| Algorithm 1 |
|---|
| Algorithm 1: Iterative BDD of product codes |
| 1    for l = 1, 2, . . . , l do |
| 2      for i = 1, 2, do |
| 3        for j = 1, 2, . . . , n do |
| 4          apply BDD to component codeword (i, j) |

Iterative Bounded-Distance Decoding

We now consider the transmission of a code-word $X \in P(\mathcal{C})$ over the BSC with crossover probability p. The conventional iterative decoding procedure consists of applying BDD first to all row component code-words and then to all column component code-words. This may be repeated $\ell$ times or until a valid code-word in $P(\mathcal{C})$ is found. Pseudocode for this iterative decoding procedure is given in Algorithm 1. The implementation of an exit-criterion is omitted for readability purposes.

Bit Error Rate Performance

In order to analyze the bit error rate (BER) of PCs under iterative BDD, the prevailing approach in the literature is to assume that no miscorrections occur in the BDD of the component codes, see, e.g., [4], [8]-[11]. To that end, we define BDD'(r) as shown in Equation 3, below.

$$BDD(r) = \begin{cases} c & \text{if } d_H(r, c) = w_H(n) \le t, \\ c' \in C & \text{if } w_H(n) > t \text{ and } d_H(r, c') \le t, \\ \text{FAIL} & \text{otherwise.} \end{cases} \quad \text{Equation 3}$$

Accordingly, BDD'(r) can be seen as an idealized version of BDD where a genie prevents miscorrections.

The asymptotic performance of genie-aided decoding can be computed using density evolution (DE) [4], [9], [10]. More-over, the error floor can be estimated by enumerating small-sized stopping sets, also known as stall patterns. Formally, a stopping set is a subset of bit positions such that every component code-word with at least one bit in the set must contain at least t+1 bits in the set. A minimal-size stopping set involves t+1 row code-words and t+1 column code-words and has size $s_{min}=(t+1)^2$. For example, the black crosses shown in FIG. 1 form such a stopping set when t=2. If we consider only stopping sets of minimal size, the BER can be approximated as:

$$BER \approx \frac{s_{min}}{n^2} M p^{s_{min}}, \quad \text{Equation 4}$$

Thus, for sufficiently small p, where $$M = \binom{n}{t+1}^2$$

is the total number of possible minimal-size stopping sets, also referred to as the stopping set's multiplicity.

Example 4

Figure 6:
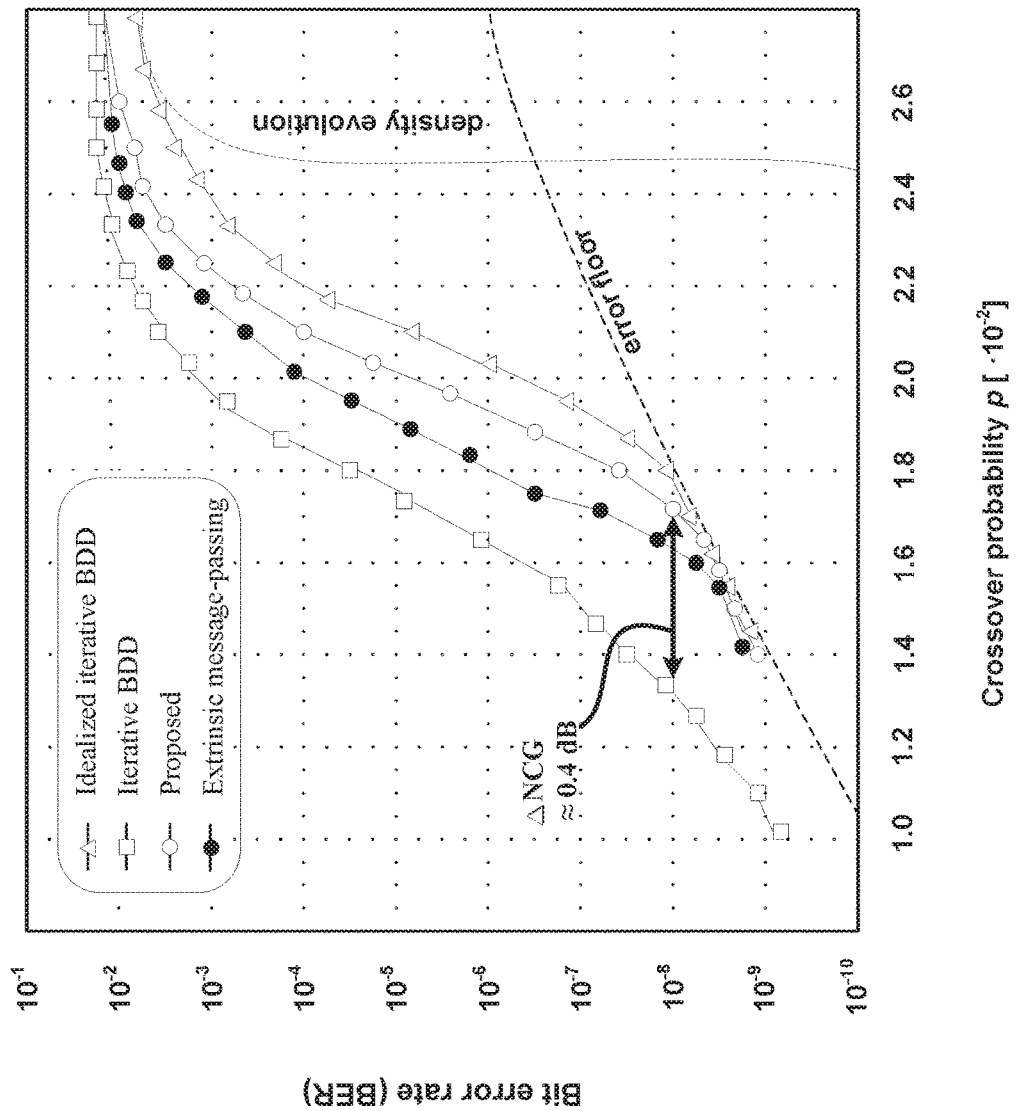
FIG. 6 is an example outcome and error floor analysis for the product code of FIG. 5, according to some embodiments.

Consider a BCH code $\mathcal{C}$ with parameters (7, 2, 1). The resulting PC P($\mathcal{C}$) has length $n^2=128^2=16384$ and code rate $\mathcal{R} =k^2/n^2 \approx 0.78$. For $\ell =10$ decoding iterations, the outcome of DE and the error floor analysis via (4) for this PC are shown in FIG. 6 by the dashed black lines. The analysis can be verified by performing idealized iterative BDD using (3). The results are shown by the blue line (triangles) in FIG. 6. However, the actual performance with true BDD (2) deviates significantly from the idealized decoding, as shown by the red line (squares) in FIG. 6. The performance can be moderately improved by treating the component codes as single-error-correcting in the first iteration [4]. This is shown by the dotted line.

In the next section, we give a detailed description of another example embodiment. The resulting BER performance for the code parameters considered in Example 4 is shown in FIG. 2 by the green line (circles). The results are discussed in more detail below.

Iterative BDD can also be interpreted as a message-passing algorithm with binary "hard-decision" messages. The corresponding message-passing rule is intrinsic, in the sense that the outgoing message along some edge depends on the incoming message along the same edge. In some examples, an extrinsic message-passing algorithm based on BDD is proposed. The BER for this algorithm when applied to the PC in Example 4 is shown in FIG. 6 by the brown line (diamonds). The extrinsic message-passing provides performance improvements over iterative BDD. However, it is know that the decoder data-flow and storage requirements can be dramatically increased for standard message-passing decoding compared to iterative BDD. One reason for this is that iterative BDD can leverage a syndrome compression effect by operating entirely in the syndrome domain. This simplification also applies to the proposed invention.

Proposed Anchor-Based Decoding

In the previous section, we have seen that there exists a significant performance gap between iterative BDD and idealized iterative BDD where a genie prevents miscorrections. The key observation we exploit to improve performance and close this gap is that miscorrections lead to inconsistencies. In particular, two component codes that protect the same bit may disagree on its value. In this section, we show how these inconsistencies can be used to (a) reliably prevent miscorrections and (b) identify miscorrected code-words in order to revert their decoding decisions.

The proposed method relies on so-called anchor code-words, which have presumably been decoded without miscorrections. Roughly speaking, the proposed method attempts to ensure that bit flips do not lead to inconsistencies with anchor code-words. Consequently, decoding decisions from code-words that are in conflict with anchors are not applied. On the other hand, a small number of anchor code-words may actually be miscorrected. Therefore the method allow for the decoding decisions of anchors to be overturned if too many other component code-words are in conflict with a particular anchor. In order to make this more precise, we start by introducing some additional concepts and definitions in this subsection.

Now, an embodiment for a simple PC is described. First, consider the BDD of a single component code-word (i, j). We explicitly regard this component decoding as a two-step process as follows. In the first step, the actual decoding is performed and the outcome is either an estimated error vector $\hat{n}$ or a decoding failure. In the second step, error-correction is performed by flipping the bits corresponding to the error locations. The algorithm relies on separating these two steps in order to perform certain consistency checks (described below) before applying the error-correction step. It is also more convenient to assume that the estimated error vector $\hat{n}$ is given in terms of a set of error locations. For component code-word (i, j), this set is denoted by $\varepsilon_{i,j}$, where $|\varepsilon_{i,j}| \leq t$. The set comprises identifiers of the component code-words that are affected by the bit flips implied by $\hat{n}$.

Example 5

Consider again the scenario described in Example 3, where the component code-word (1, 4) shown in FIG. 5 miscorrects with an estimated error vector $\hat{n}$ such that $\hat{n}_i=1$ for $i \in \{6, 14\}$ and $\hat{n}_i=0$ elsewhere. The corresponding set of error locations is given by $\varepsilon_{1,4}=\{(2, 6), (2, 14)\}$.

Furthermore, we use a set $\mathcal{L}_{i,j}$ for each component code-word in order to keep track of conflicts that may arise between code-words due to miscorrections. Lastly, each component code-word has an associated status to signify its current state in the iterative decoding. The status values range from 0 to 3 with the following meaning:

0: anchor code-word
1: BDD successful (error locations are available in $\varepsilon_{i,j}$)
2: BDD failed
3: frozen codeword The precise use of the status and the transition rules between different status values are described in the following.

Main Algorithm Routine

The algorithm is initialized by performing the decoding step for all component code-words, i.e., all component code-words (i, j) for $i \in \{1, 2\}$ and $j \in [n]$ are decoded without applying any bit flips. Depending on the decoding outcome, the status of each component codeword is set to either 1 (if the decoding was successful) or 2 (if the decoding failed).

Algorithm 2
Algorithm 2: Main routine of anchor-based decoding

```
1  if (i,j) .status = 1, then                      / * codeword is decodable * /
2      for each (k, ∈ ε_{i,j}l) do                  / * consistency checks * /
3          if (k,l) .status = 0 then               / * conflict with anchor * /
4              if |L_{k,l}| ≥ δ then
5                  Add (k, l) to β                 / * mark for backtracking * /
6              else
7                  (i, j) .status ← 3              / * freeze component codeword * /
8                  Add (k,l) to L_{i,j}            / * save the conflict * /
9                  Add (i,j) to L_{k,l}            / * save the conflict * /
10 if (i,j) .status = 1 then                       / * if not frozen * /
11     for each (k, l) ∈ β do
12         backtrack anchor (k, l)                 / * see Alg. 3 * /
```

Algorithm 2
Algorithm 2: Main routine of anchor-based decoding

| | | |
|---|---|---|
| 13 | for each (k, l) ∈ $\varepsilon_{i,j}$ do | |
| 14 |    error-correction step for (i,j,k,l) | /* see Alg. 4 */ |
| 15 |    (i, j) .status ← 0 | /* component codeword becomes an anchor */ |

We then iterate $\ell$ times over the component code-words in the same fashion as in Algorithm 1, but replacing line 4 with lines 1-15 from Algorithm 2. Algorithm 2 represents the main routine of the proposed anchor-based decoding. It can be divided into four steps which are described in the following.

Step 1 (Line 1): If the decoding was successful for the component code-word (i, j), i.e., its status is 1, we proceed to the next step, otherwise, we skip to the next code-word.

Step 2 (Lines 2-9): For each found error location (k, l)∈$\varepsilon_{i,j}$, a consistency check is performed. That is, one checks if the implied component code-word (k, l) corresponds to an anchor. If so, note that $|\mathcal{L}_{k,l}|$ is the number of conflicts that this anchor is already involved in. This number is then compared against a fixed threshold δ. If $|\mathcal{L}_{k,l}|>δ$, the anchor (k, l) is deemed unreliable and it is marked for backtracking by adding it to the backtracking set B. On the other hand, if $|\mathcal{L}_{k,l}|<δ$, the code-word (i, j) is frozen by changing its status to 3. Moreover, the conflict between the (now frozen) code-word and the anchor is stored by modifying the respective sets $\mathcal{L}_{j,k}$ and $\mathcal{L}_{k,l}$. Frozen code-words are always skipped (in the loop of Algorithm 1) for the rest of the decoding unless either the conflicting anchor is backtracked or any bits in the frozen code-word change.

Step 3 (Lines 10-12): If the component code-word (i,j) still has status 1, the bit flips are consistent with all reliable anchors, i.e., anchors that are involved in fewer than δ other conflicts. If that is the case, the algorithm proceeds by backtracking all anchor code-words in the set B (if there are any). Generally, backtracking involves reversing all previously applied bit flips for a corresponding anchor. Moreover, the backtracked code-word loses its anchor status. The backtracking routine is implemented in Algorithm 3 and described in more detail below.

Step 4 (Lines 13-15): Lastly, the error-correction step for code-word (i, j) is applied, i.e., the bits (i, j, k, l) corresponding to all error locations (k, l)∈$\varepsilon_{i,j}$ are flipped. The error-correction step is implemented in Algorithm 4 and described below. Finally, the code-word (i, j) becomes an anchor by changing its status to 0.

Algorithm 3
Algorithm 3: Backtracking anchor codeword (i,j)

| | | |
|---|---|---|
| 1 | for each (k, l) ∈ $\mathcal{L}_{i,j}$ do | /* remove conflicts */ |
| 2 |    remove (k, l) from $\mathcal{L}_{i,j}$ | |
| 3 |    remove (i, j) from $\mathcal{L}_{k,l}$ | |
| 4 |    if $\mathcal{L}_{k,l}$ is empty then | /* no more conflicts */ |
| 5 |       (k, l) .status ← 1 | /* unfreeze the codeword */ |
| 6 | for each (k, l) ∈ $\varepsilon_{i,j}$ do | |
| 7 |    error-correction step for (i,j,k,l) | /* see Alg. 4 */ |
| 8 | (i,j) .status ← 3 | /* freeze codeword */ |

In the following, the above steps are illustrated with the help of two examples. For both examples, we assume that a component code with error-correcting capability t=2 is employed. Moreover, the conflict threshold is set to δ=1.

Example 6

Figure 7B:
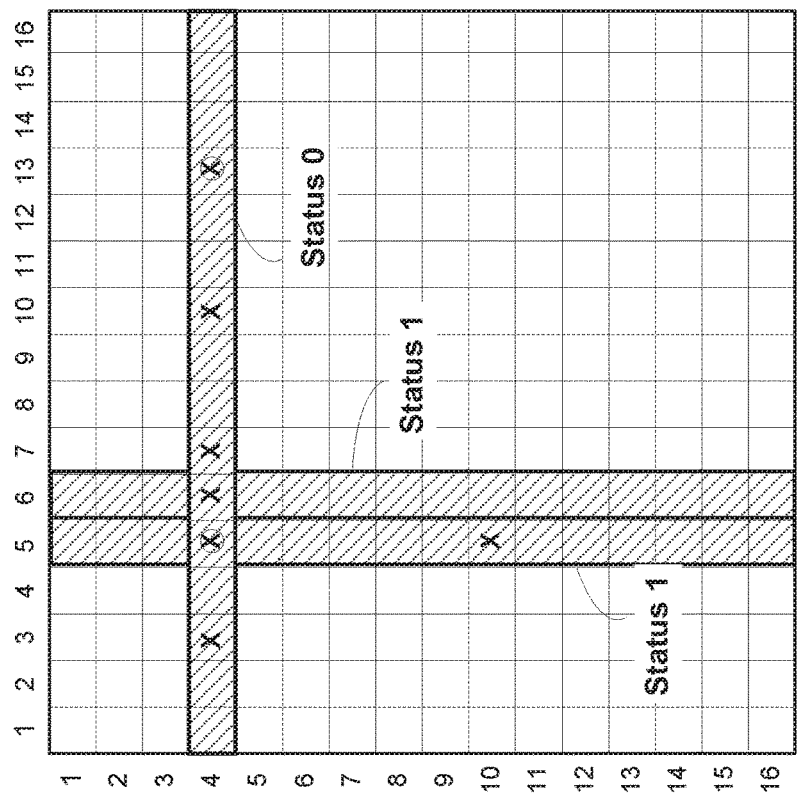
FIGS. 7a-7d illustrate an example decoding scenario, according to some embodiments.
Figure 7A:
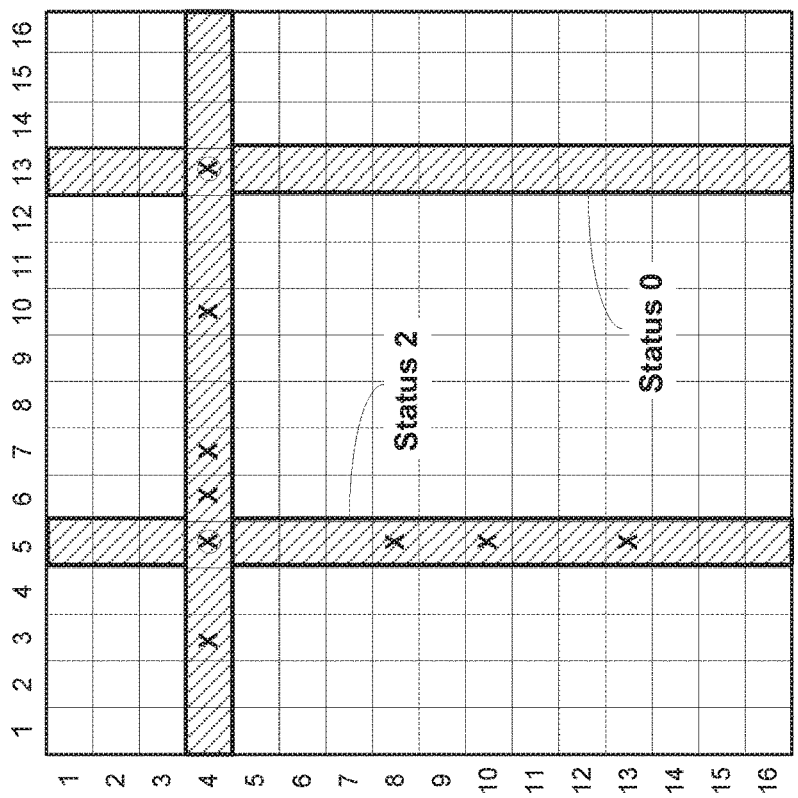
Figure 7D:
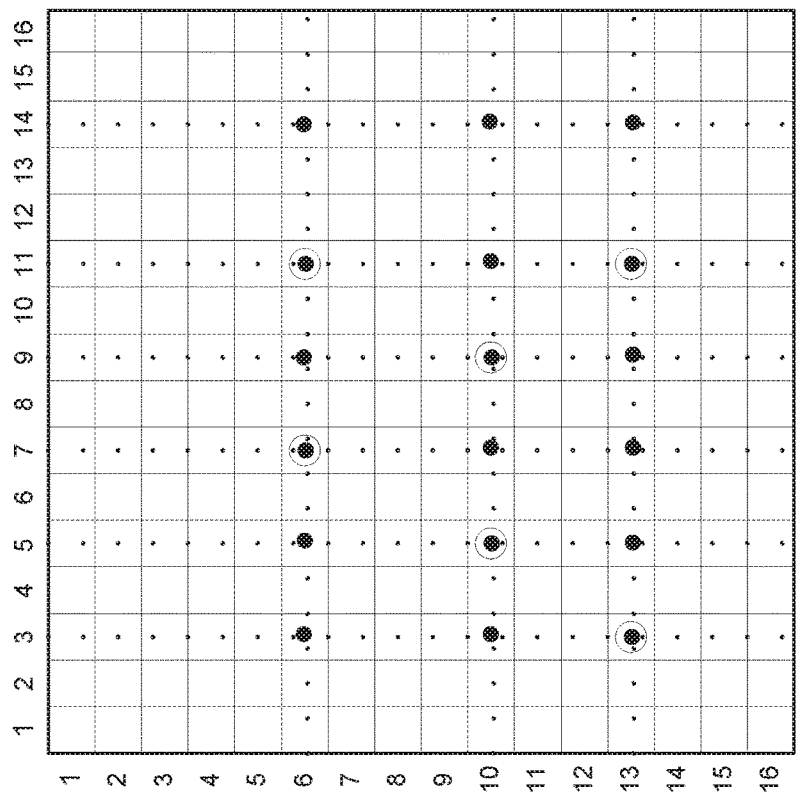
Figure 7C:
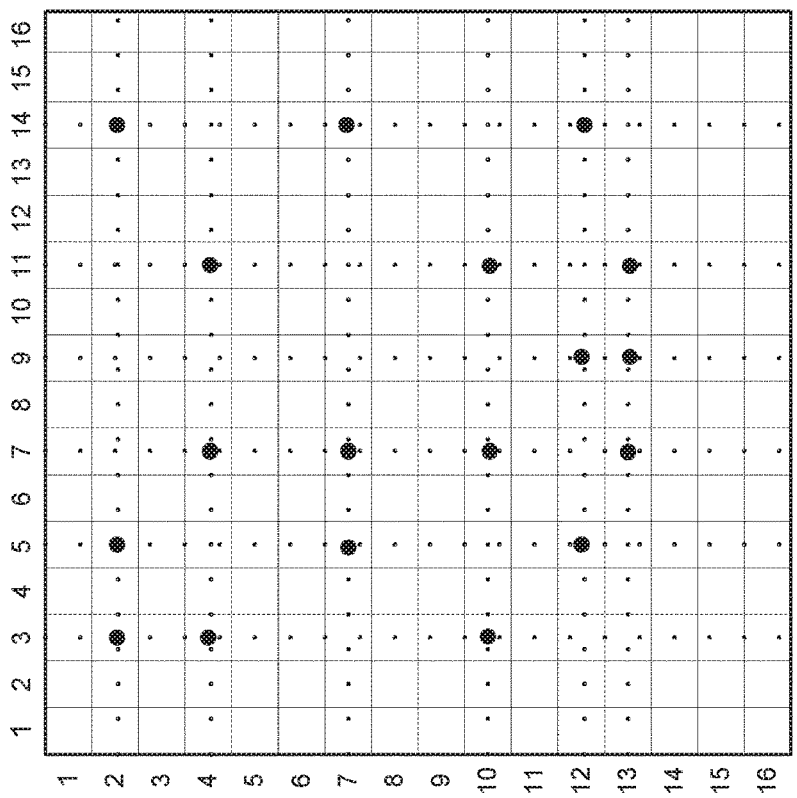

Consider the scenario depicted in FIG. 7a. Assume that we are at (i, j)=(1, 4), corresponding to a row component code-word with four attached errors shown by the black crosses. The code-word has status 1 but it is miscorrected with $\varepsilon_{3,4}$={(2, 5), (2, 13)} shown by the red crosses. Code-word (2, 5) is assumed to have status 2 (i.e., BDD failed with three attached errors) and therefore the first consistency check is passed. However, assuming that the code-word (2, 13) is an anchor without any other conflicts, i.e., $\mathcal{L}_{2,13}$=0, the code-word (1, 4) is frozen during step 2. Hence, no bit flips are applied and the miscorrection is prevented. The conflict is stored by updating the two conflict sets as $\mathcal{L}_{1,4}$={(2, 3)} and $L_{2,3}$={(1, 4)}, respectively.

Example 7

Consider the scenario depicted in FIG. 7b, where we assume that the code-word (1, 4) is a miscorrected anchor without conflicts (i.e., $\mathcal{L}_{1,4}$=0) and error locations $\varepsilon_{1,4}$={(2, 5), (2, 13)}. Assume that we are at (i, j)=(2, 5). The code-word (2, 5) has two attached error, thus its status is 1 with $\varepsilon_{2,1}$={(1, 4), (1, 10)}. During step 2, the code-word (2, 5) is frozen because there is a conflict with anchor (1, 4). After freezing the code-word, we have $\mathcal{L}_{1,4}$={(2, 5)} and $L_{2,5}$={(1, 4)}. We skip to the next code-word (2, 6), which has status 1 and $\varepsilon_{2,6}$={(1, 4)}. The implied bit flip is inconsistent with the anchor (1, 4). However, since this anchor is already in conflict with code-word (2, 5) (and, hence, $|\mathcal{L}_{1,4}|$=1=δ), the anchor is marked for backtracking and the error-correction step for bit (2, 6, 1, 4) will be applied.

Backtracking

In Example 7, we have encountered a scenario that leads to the backtracking of a miscorrected anchor. The actual backtracking routine is implemented in Algorithm 3 and described in the following. First, all conflicts caused by the anchor are removed by modifying the respective conflict sets. All code-words (k, l)∈$\mathcal{L}_{i,j}$ for an anchor (i, j) necessarily have status 3, i.e., they are frozen. After removing conflicts, such code-words may be conflict-free, in which case their status is changed to 1. Next, all previously applied bit flips are reversed. In order to perform this operation, it is necessary to store the set $\varepsilon_{i,j}$ for each anchor. Finally, the code-word loses its anchor status. The code-word is still decodable with the same error set $\varepsilon_{i,j}$ because we have just flipped the bits. Thus, in principle the new code-word status can be chosen to be either 1 or 3. However, backtracked anchors are likely to have miscorrected. We therefore freeze the code-word by setting its status to 3 after the backtracking.

Algorithm 4
Algorithm 4: Error-correction step for bit (i, j, k, l)

```
1     if    (k, l) .status ! = 0 then
2            flip the bit (I, j, k, l)
3            ℛ ← (k, l).decode              /* ℛ indicates success (1) or failure (0) */
4            if (k, l) . status = 1 and ℛ = 0 then
5                (k, l) status ← 2
6            else if (k, l) .status = 2 and ℛ = 1 then
7                (k, l) .status ← 1
8            else if (k, l) .status = 3 then
9                if ℛ = 0 then
10                   (k, l) .status ← 2
11               else
12                   (k,l) . status ← 1
13               for each (k',l") ∈ 𝓛_{k,l} do        /* remove conflicts */
14                   remove (k,l) from 𝓛_{k',l'}
15                   remove (k',l') from 𝓛_{k,l}
```

Error-Correction

The error-correction step is implemented in Algorithm 4 and described in the following. The algorithm input is a parameter tuple (i, j, k, l) where (i, j) is the code-word that initiated the bit flip and (k, l) is the corresponding code-word affected by it. Note that Algorithm 4 can be reached from both the main decoding routine (Algorithm 2, lines 13-14) and as part of the backtracking process (Algorithm 3, lines 6-7). If the routine is reached via backtracking, it is possible that the affected code-word (k, l) is now an anchor. In this case, we use the convention to trust the anchor's decision about the hit (i,j, k, l) and not apply any changes. In all other cases, apart from actually flipping the bit (i, j, k, l) (line 2), error-correction also triggers a re-decoding of the affected component code-word (k, l) (line 3) and a possible status change depending on the decoding outcome (lines 4-15). If the bit flip affects a frozen code-word, the code-word is unfrozen and we remove all conflicts that the code-word is involved in.

Post-Processing

In case the anchor-based decoding terminates unsuccessfully, one may use some form of post-processing (PP) in order to improve performance. For the conventional iterative BDD, several different PP methods have been studied in the literature [13]-[18]. In particular, let $\mathcal{F}_i$ denote the set of failed component code-words of type i after an unsuccessful decoding attempt, i.e., $\mathcal{F}_1$ and $\mathcal{F}_2$ are, respectively, row and column code-words that have nonzero syndrome. The intersection of these code-words defines a set of bit positions, as shown in Equation 5, below.

$$\mathcal{L} = \{(i,j,k,l)|(i,j) \in \mathcal{F}_1 \text{ and } (k,l) \in F_2\} \quad \text{Equation 5}$$

One popular PP method is bit-flip-and-iterate, where the bits in the intersection (5) are first flipped and then iterative decoding is resumed for one or more iterations. This method has been applied to PCs [13], [16], half-product codes [17], and staircase codes [18]. Another method is algebraic-erasure PP, where the bits in the intersection (5) are treated as erasures. An algebraic erasure decoder is then used to recover the bits. Assuming that there are no miscorrected code-words, algebraic-erasure PP succeeds as long as either $|\mathcal{F}_1|<d_{min}$ or $|\mathcal{F}_2|<d_{min}$ holds. This type of PP has been applied to braided codes in [14] and to half-product codes in [15].

In principle, the above PP methods can also be combined with the anchor-based decoding without change. However, it is possible to improve the effectiveness of PP by exploiting some additional information that is available for the anchor-based decoding. In particular, recall that it is necessary to keep track of the error locations of anchors in case they are backtracked. If the anchor-based decoding fails, these error locations can be used for the purpose of PP as follows. Assume that we have determined the sets $\mathcal{F}_1$ and $\mathcal{F}_2$. Then, we can check for anchors which satisfy the condition:

$$\varepsilon_{i,j} \subset \mathcal{F} \text{ and } |\varepsilon_{i,j}|=t \quad \text{Equation 6}$$

Assuming in Equation that $\mathcal{F} = \mathcal{F}_1 \cup \mathcal{F}_2$, i.e., anchors whose error locations overlap entirely with the set of failed component code-words. For the algebraic-erasure decoding PP, it is beneficial to include such anchors into the respective sets $\mathcal{F}_1$ and $\mathcal{F}_2$ (even though they have zero syndrome), as long as $|\mathcal{F}_1|<d_{min}$ and $|\mathcal{F}_2|<d_{min}$ remain satisfied.

Simulation Results and Discussion

In this section, we present and discuss simulation results for the embodiment described in the previous section assuming different BCH code parameters. For the conflict threshold, we tested different values $\delta \in \{0, 1, 2, 3\}$ for a wide variety of component codes and BSC crossover probabilities. In all cases, $\delta=1$ was found to give the best performance. Hence, $\delta=1$ is assumed in the following.

Results without Post-Processing

Recall that for Example 4 in Sec. III-E, a BCH component code with parameters (7, 2, 1) and l=10 decoding iterations are assumed. For these parameters, the BER of the proposed method is shown in FIG. 6 by the green line (circles). It can be seen that the method closely approaches the performance of the idealized iterative BDD in the waterfall regime. Moreover, virtually miscorrection-free performance is achieved in the error-floor regime. The proposed decoding achieves a net coding gain (NCG) improvement of approximately $\Delta$NCG=0.4 dB, as indicated by the arrow in FIG. 6.

Figure 8:
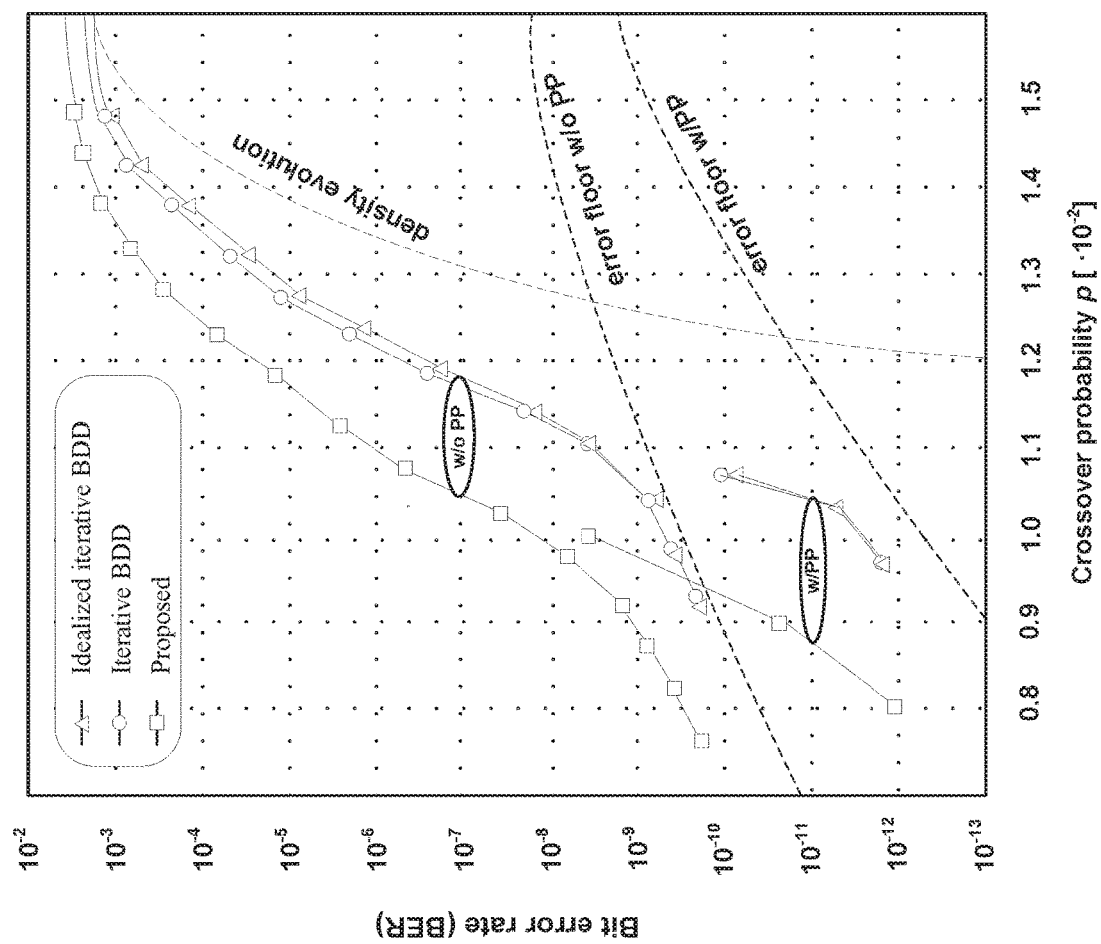
FIG. 8 illustrates example BER results, according to some embodiments.

Next, we provide a direct comparison with the work in [19], where the authors propose a hardware architecture for a PC based on a BCH code with parameters (8, 2, 1). The BCH code is further shortened by 61 bits, leading to an effective length of n=195 and dimension k=178. The shortening gives a desired code rate of $R=k^2/n^2=178^2/195^2 \approx 0.833$. The number of decoding iterations is set to l=4. For these parameters, BER results are shown in FIG. 8 for iterative BDD, proposed decoding, and idealized iterative BDD (labeled "w/o PP"). As before, the outcome of DE and the error floor prediction via (4) are shown by the dashed black lines as a reference. Compared to the results shown in FIG. 8, the proposed decoding approaches the performance of the idealized iterative BDD even closer and virtually miscorrection-free performance is achieved for BERs below 10-7. This can be attributed to the quite extensive code shortening, which reduces the probability of miscorrecting compared to an unshortened component code.

Results with Post-Processing

The above examples further consider the application of bit-flip-and-iterate PP in order to reduce the error floor. The simulation data was provided and the results are reproduced for convenience in FIG. 8 by the red line (squares) labeled "w/PP" (compare [19, FIGS. 7*a*-7*d*]). For this embodiment, we used instead the algebraic-erasure PP as described in Sec. IV-F. The performance of the proposed decoding including PP is shown in FIG. 8 and virtually overlaps with the performance of idealized iterative BDD for BERs below 10-11. The new error floor can be estimated using expression (4) with $$M = 297{,}200 \binom{n}{6}^2 \text{ and } s_{min} = 18.$$

It is shown in FIG. 8 by the dashed black line labeled "error floor w/PP." This analysis is based on the dominant stopping sets of size 18 which involve 6 row and 6 column codewords, as illustrated by the black crosses in FIG. 7(*c*). Overall, the improvements translate into an additional NCG of around 0.2 dB at a BER of 10-12 over the results presented above.

We remark that without the modification to the error-correction example above, the PP performance for the proposed decoding would be slightly decreased. Indeed, we found that a dominant error event for the considered embodiment is such that 3 row (or column) code-words miscorrect towards the same estimated error pattern $\hat{n}$ of weight 6. This scenario is illustrated in FIG. 7(*d*). We did not encounter similar error events for the iterative BDD, indicating that the proposed decoder introduces a slight bias towards an estimated error pattern, once it is "anchored". For such an error event, 6 column code-words are not decodable, whereas all row code-words are decoded successfully with a zero syndrome. This implies that the set $\mathcal{F}_2$ is empty and therefore the bit intersection (5) is empty as well. Hence, conventional PP would fail. On the other hand, with high probability condition (6) holds for all 3 miscorrected row code-words. The condition may also hold for correctly decoded row anchors. However, there is no harm in including up to two additional correctly decoded row code-words into the set $\mathcal{F}_2$.

Example 2—Miscorrection-Free Decoding of Staircase Codes

Hard-decision forward error correction (HD-FEC) can offer dramatically reduced complexity compared to soft-decision FEC, at the price of some performance loss. HD-FEC is used, for example, in regional/metro optical transport networks (OTNs) and has also been considered for other cost-sensitive applications such as optical data center interconnects. Our focus in on staircase codes, which provide excellent performance and have received considerable attention in the literature.

Similar to classical product codes, staircase codes are built from short component codes and decoded by iteratively applying bounded-distance decoding (BDD) to the component codes. For the purpose of this application, BDD of a t-error-correcting component code can be seen as a black box that operates as follows. Let r=c+e, where c, e∈{0, 1}$^n$ denote a component code-word and random error vector, respectively, and n is the code length. BDD yields the correct code-word c if $d_H$ (r, c)=$w_H$(e)≤t, where $d_H$ and $w_H$ denote Hamming distance and weight, respectively. On the other hand, if $w_H$(e)>t, the decoding either fails or there exists another codeword c' such that $d_H$ (r, c')≤t. In the latter case, BDD is technically successful but the decided codeword c' is not the correct one. Such miscorrections are highly undesirable because they introduce additional errors into the iterative decoding process and significantly degrade performance.

In one example, a novel iterative HD decoding algorithm for staircase codes which reduces the effect of miscorrections on the performance is disclosed. The algorithm provides significant post-FEC bit error rate improvements, in particular when t is small (which is typically the case in practice). As an example, for t=2, the algorithm can improve performance by roughly 0.4 dB and reduce the error floor by over an order of magnitude, up to the point where the iterative decoding process is virtually miscorrection-free. Error floor improvements are particularly important for applications with stringent reliability constraints such as OTNs.

Staircase Codes and Iterative Decoding

Let $\mathcal{C}$ be a binary linear component code with length n and dimension k. Assuming that n is even, a staircase code with rate $\mathcal{R}$ =2k/n−1 based on $\mathcal{C}$ is defined as the set of all matrix sequences $\mathcal{B}_k \in \{0,1\}^{a \times a}$, k=0, 1, 2, . . . , such that the rows in [$\mathcal{B}_{k-1}^T$, $\mathcal{B}_k$] for all k≥1 form valid codewords of $\mathcal{C}$, where a=n/2 is the block size and $\mathcal{B}_0$ is the all-zero matrix.

We use extended Bose-Chaudhuri-Hocquenghem (BCH) codes as component codes, i.e., a BCH code with an additional parity bit formed by adding (modulo 2) all $2^\upsilon - 1$ coded bits of the BCH code, where $\upsilon$ is the Galois field extension degree. The overall extended code then has length n=$2^\upsilon$ and guaranteed dimension k=$2^\upsilon$−$\upsilon$t−1. The extra parity hit increases the guaranteed minimum distance to $d_{min}$=2t+2.

Figure 9:
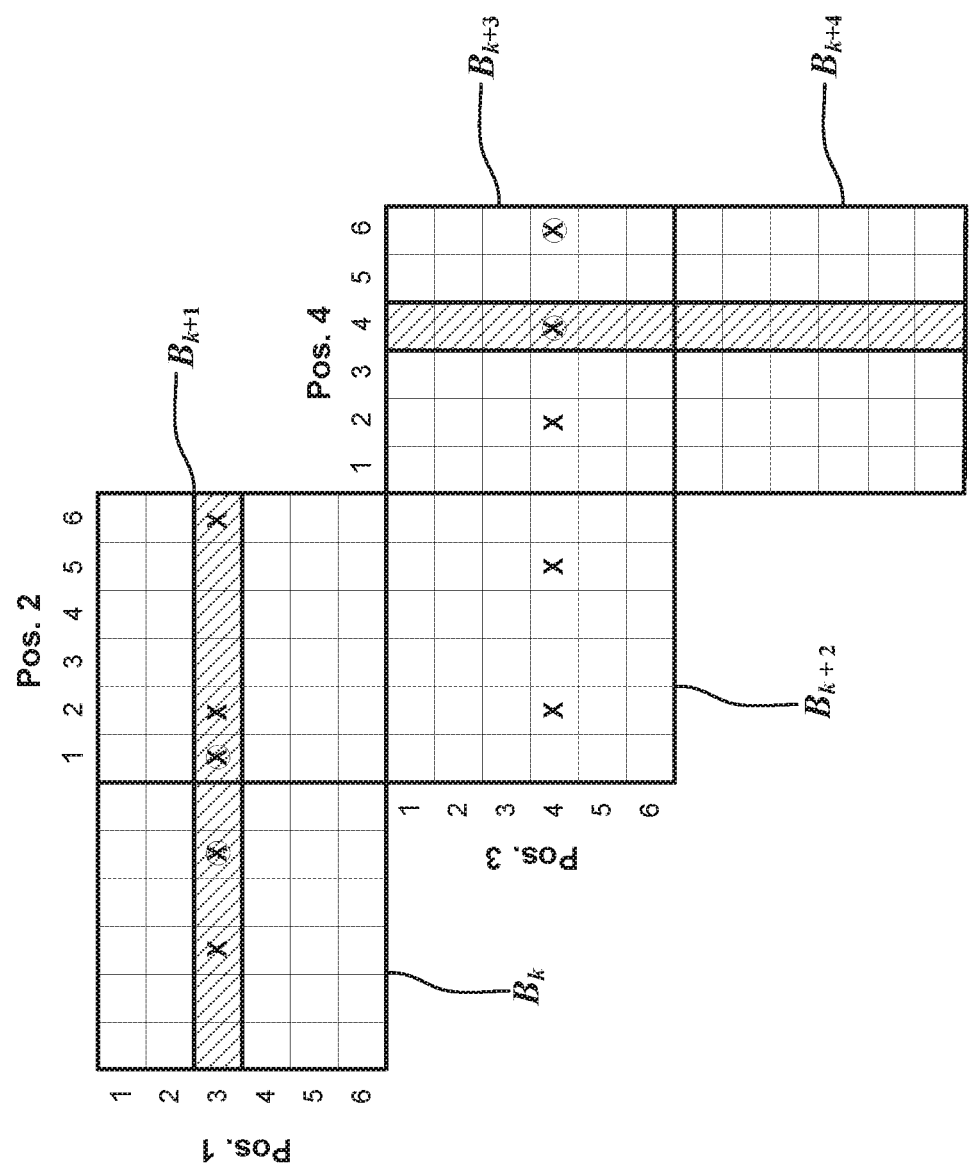
FIG. 9 illustrates a conventional decoding procedure for staircase codes using a sliding window, according to some embodiments.

We briefly review the conventional decoding procedure for staircase codes which uses a sliding window comprising W received blocks $\mathcal{B}_k, \mathcal{B}_{k+1}, \ldots, \mathcal{B}_{k+W-1}$. This is illustrated in FIG. 9 for W=5 and a=6. It is convenient to identify each component code in the window by a tuple (i, j), where i∈{1, 2, . . . , W−1} indicates the position relative to the current decoding window and j ∈{1, 2, . . . , a} enumerates all codes at a particular position. As an example, the component codes (1, 3) and (4, 4) are highlighted in blue in FIG. 9. Pseudo-code for the conventional decoding produce is given in Algorithm 5, below. Essentially, for each decoding window, all component codes are decoded $\ell$ times, after which the window shifts to the next position.

Performance Analytics

Analyzing the post-FEC bit error rate of staircase codes under the conventional decoding procedure is challenging. A major simplification is obtained by assuming that no miscorrections occur in the BDD of the component codes. In this case, it is possible to rigorously characterize the asymptotic performance as a→∞ using a technique called density evolution. Moreover, the error floor can be estimated by enumerating harmful stall patterns. However, if miscorrections are taken into account, both the asymptotic and error floor predictions are nonrigorous and become inaccurate.

Example 1

Figure 10:
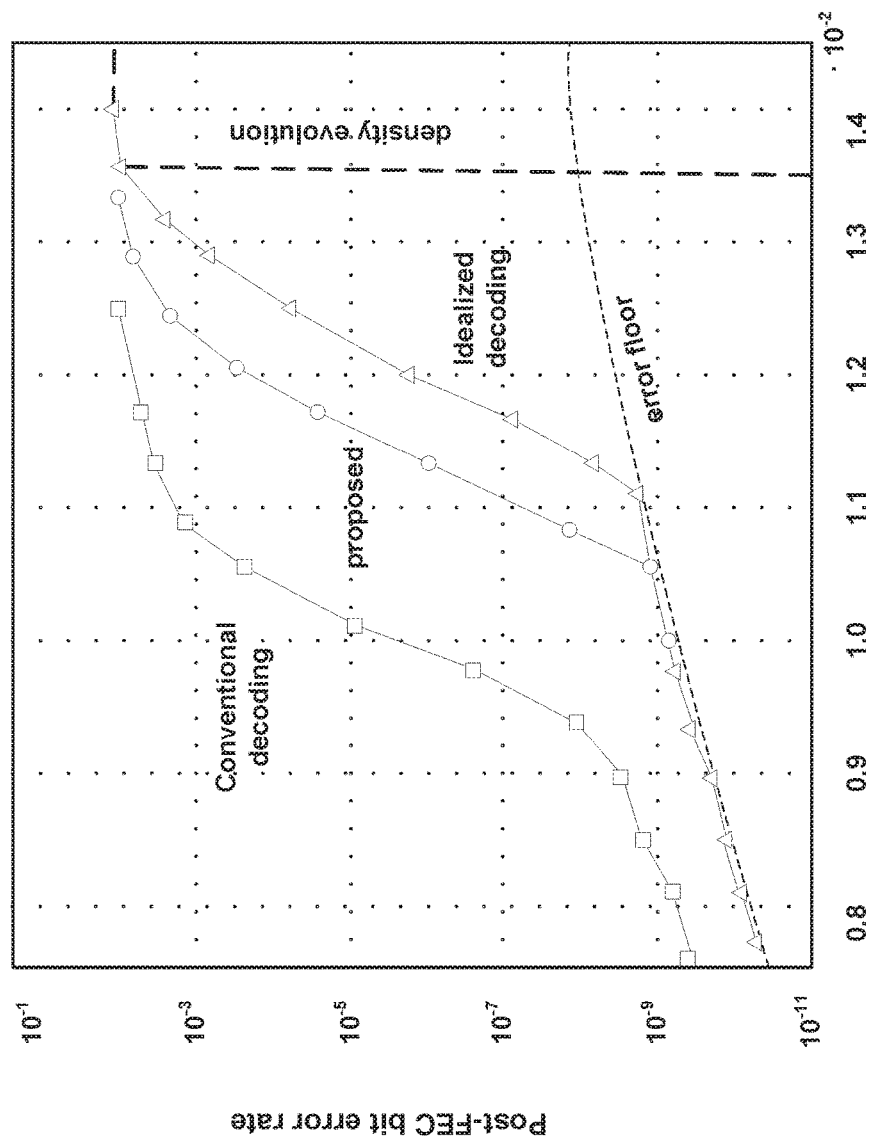
FIG. 10 illustrates example density evolution and error floor predictions, according to some embodiments.

Let $\upsilon$=8 and t=2, which gives a staircase code with a=128 and $\mathcal{R}$ =0.867. For window decoding parameters W=8 and $\ell$ =7, the density evolution and error floor predictions are shown in FIG. 10 by the dashed lines. The analysis can be verified by performing idealized decoding, where miscorrections are prevented during BDD. The results are shown by the blue line (triangles) in FIG. 10 and accurately match the theoretical predictions. However, the actual performance with true BDD deviates from the idealized decoding, as shown by the red line (squares).

The performance degradation with respect to idealized decoding becomes less severe for larger values of t. Unfortunately, small values of t are commonly used in practice because BDD can be implemented very efficiently in this case. We note at this point that there exist several works that attempt to quantify the performance loss due to miscorrections. In terms of error floor, the work in introduces a heuristic parameter, whose value unfortunately has to be estimated from simulative data.

Algorithm 5
Algorithm 5: Window decoding of staircase codes

```
1    k ← 0
2    while true do
3        for l = 1, 2, . . . , ℓ do
4            for l = W, W − 1, . . . , 1 do
5                for j = 1, 2, . . . , a do
6                    apply BDD to component code (i j)
7            output decision for 𝓑_k and shift window
8        k ← k = 1
```

The main idea in order to improve performance is to systematically exploit the fact that miscorrections lead to inconsistencies, in the sense that two component codes that protect the same bit may disagree on its value. In the following, we show how these inconsistences can be used to (a) reliably prevent miscorrections and (b) identify miscorrected code-words in order to revert their decoding decisions.

Algorithm 5 relies on so-called anchor code-words, which have presumably been decoded without miscorrections. Roughly speaking, we want to make sure that bit flips do not lead to inconsistencies with anchor code-words. Consequently, decoding decisions from code-words that are in conflict with anchors are not applied. However, a small number of anchor code-words may be miscorrected and we allow for the decoding decisions of anchors to be reverted if too many other code-words are in conflict with a particular anchor.

In order to make this more precise, we regard the BDD of a component code (i, j) as a two-step process. In the first step, the decoding is performed and the outcome is either a set of error locations $\varepsilon_{i,j} \subset \{1, 2, \ldots, n\}$ where $|\varepsilon_{i,j}| \leq t$, or a decoding failure. In the second step, error-correction is performed by flipping the bits corresponding to the error locations. Initially, we only perform the decoding step for all component codes, i.e., all component codes in the decoding window are decoded without applying any bit flips. We then iterate l times over the component codes in the same fashion as in Algorithm 5, but replacing line 6 with the following four steps:

Step 1: If no decoding failure occurred for the component code-word (i, j), we proceed to step 2, otherwise, we skip to the next code-word.

Step 2: For each $e \in \varepsilon_{i,j}$, check if e corresponds to an anchor code-word. If so, let $\mathcal{C}$ be the number of other conflicts that the anchor is involved in. If $\mathcal{C} < T$, where T is a fixed threshold, the code-word (i, j) is frozen and we skip to the next codeword. Frozen code-words are always skipped for the rest of the decoding unless any of their bits change. If $\mathcal{C} \geq T$, the anchor is marked for backtracking.

Step 3 Error-correction for codeword (i, j) is applied, i.e., the bits at all error locations in are flipped. We also apply the decoding step again for code-words that had their syndrome changed due to a bit flip. Finally, the codeword (i, j) becomes an anchor.

Step 4: Previously applied bit flips are reversed for all anchor code-words that were marked for backtracking during step 2. These code-words are no longer anchors and all frozen code-words that were in conflict with these code-words are unfrozen.

The following two examples illustrate the above steps for t=2 and T=1 with the help of FIG. 7.

Example 2

Assume that we are at (i, j)=(3, 4), corresponding to a component code with three attached errors shown by the black crosses. The codeword is miscorrected with $\varepsilon_{3,4}=\{10, 12\}$ shown by the red crosses. Assuming that the codeword (4, 4) is an anchor without any other conflicts, the code-word (3, 4) is frozen during step 2 and no bit flips are applied.

Example 3

Let the code-word (1, 3) in FIG. 7 be a miscorrected anchor with error locations $\varepsilon_{1,3}=\{5, 7\}$. Assume that we are at (i, j)=(2, 1). The code-word (2, 1) has one attached error, thus $\varepsilon_{2,1}=\{3\}$. During step 2, the code-word (2, 1) is frozen and we skip to code-word (2, 2) with $\varepsilon_{2,2}=\{3, 10\}$. The bit flip at e=3 is inconsistent with the anchor (1, 3), but, since this anchor is already in conflict with (2, 1) (and, hence, $\mathcal{C}=T=1$), the anchor is marked for backtracking. The bits according to $\varepsilon_{2,2}$ are then flipped in step 3 and the anchor (1, 3) is backtracked in step 4.

The previous example shows how a miscorrected anchor is backtracked. Since we do not know if an anchor is miscorrected or not, it is also possible that we mistakenly backtrack "good" anchors. Fortunately, this is unlikely to happen for long component codes because the additional errors due to miscorrections are approximately randomly distributed within the codeword. This implies that errors of two (or more) miscorrected code-words rarely overlap.

For the algorithm to work well, a sufficiently large fraction of code-words at each position should be "good" anchors. However, when the decoding window shifts and a new block is added, no anchors exist at the last position W−1. We found that it is therefore beneficial to artificially restrict the error-correcting capability of these component codes in order to avoid anchoring too many miscorrected code-words. For example, for t=2, all component codes at position W−1 are treated as single-error-correcting. This restriction reduces the probability of miscorrecting a component code by roughly a factor of n, which is significant for long component codes. Note that due to the window decoding, we are merely gradually increasing the error-correction capability: once the decoding window shifts, the component codes shift as well and they are then decoded with their full error-correcting capability.

We remark that essentially the same algorithm can also be applied to product and other "product-like" code constructions, e.g., half-product or braided codes.

Decoding Complexity

In terms of decoding complexity, one of the main advantages of iterative HD decoding of staircase codes compared to message-passing decoding of LDPC codes is the significantly reduced decoder data flow requirement[3]. While a thorough complexity analysis for the proposed algorithm is beyond the scope of this paper, we note that the algorithm can operate entirely in the syndrome domain, thereby leveraging the syndrome compression effect that is described in[3]. However, additional storage is needed compared to the conventional decoding to keep track of the error locations of anchor code-words (in case they are backtracked) and to store the conflicts between codes.

Results and Discussions

We consider the same parameters as in Example 1, i.e., $\upsilon=8, t=2, W=8$, and $\ell=7$. The conflict threshold is set to T=1 and we apply the error-correction capability restriction for component codes at position W−1 as described above. Simulation results for the proposed algorithm are show in FIG. 2 by the green line (circles). It can be seen that the performance is significantly improved compared to the conventional decoding. In particular in terms of the error floor, the performance is virtually identical to the idealized decoding where miscorrections are prevented. Overall, the improvements translate into an additional coding gain of around 0.4 dB at a post-FEC bit error rate of $10^{-9}$ over the conventional decoding.

Note that the staircase code parameters were chosen such that the error floor is high enough to be within the reach of software simulations. For OTNs, post-FEC bit error rates below $10^{-15}$ are typically required. In this case, other code parameters should be used or one may apply post-processing techniques to reduce the error floor below the application requirements.

We have shown that the post-FEC performance of staircase codes can be significantly improved by adopting a modified iterative HD decoding algorithm that reduces the effect of miscorrections. For component codes with error-correcting capability t=2, an additional coding gain of around 0.4 dB can be achieved. Moreover, the error floor can be reduced by over an order of magnitude, giving virtually miscorrection-free performance.

The invention claimed is:

1. A method for decoding forward error correction codes, the method comprising:
   decoding a plurality of component codes, the plurality of component codes comprising code symbols, for which at least one code symbol is involved in multiple component codes; and
   analyzing the decoding of each of the plurality of component codes to generate an outcome, wherein analyzing the decoding of each of the plurality of component codes comprises:
      estimating at least one possible error location;
      storing information related to the at least one possible error location;
      storing state information; and
      updating the state information based on: information related to the generated outcome; and a previous version of the state information.

2. The method of claim 1, wherein the step of decoding the plurality of component codes is performed by a component code decoder, the component code decoder configured to output the information related to the at least one possible error location.

3. The method of claim 2, wherein the component code decoder is a hard decision decoder.

4. The method of claim 1, wherein the state information comprises a plurality of symbol estimates.

5. The method of claim 4, wherein updating the state information further comprises using the information related to the generated outcome to change at least one symbol estimate and revert at least one previous change.

6. The method of claim 5, wherein updating the state information further comprises preventing a correction of at least one estimated error that coincides with a reliable code.

7. The method of claim 6, wherein updating the state information further comprises:
   tracking a quantity of estimated miscorrections that coincide with a particular component code;
   reverting the at least one previous change that coincides with the particular component code based on the quantity of estimated errors exceeding a threshold value; and
   marking the particular component code as unreliable.

8. The method of claim 1, wherein the state information comprises a value indicating whether the component code is reliable.

9. The method of claim 1, wherein the state information comprises an array of corrected error locations that have been corrected by the component code.

10. The method of claim 1, further comprising stopping the decoding process based on an established termination condition being satisfied.

11. The method of claim 1, further comprising correcting at least one remaining error associated with the component code in a post-processing process.

12. The method of claim 11, wherein the at least one remaining error comprises:
   marking a set of component codes as unreliable based on the state information;
   locating at least one intersection point among the set of component codes marked as unreliable;
   changing the code symbols located at each of the at least one intersection point; and
   resuming the step of decoding the plurality of component codes.

13. The method of claim 11, wherein correcting the at least one remaining error comprises:
   marking a set of component codes as unreliable based on the state information; and
   using a specialized decoder to decode the set of component codes marked as unreliable.

14. An apparatus for decoding forward error correction codes, the apparatus comprising:
   a memory; and
   at least one electronic processor coupled to the memory, the at least one electronic processor configured to:
      decode a plurality of component codes, the plurality of component codes comprising code symbols, wherein at least one subset of code symbols is a codeword of a component code; and
      analyze the decoding of each of the plurality of component codes to generate an outcome, wherein analyzing the decoding of each of the plurality of component codes comprises:
         estimating at least one possible error location;
         storing information related to the at least one possible error location;
         storing state information; and
         updating the state information based on the information related to the outcome and based on a previous version of the state information.

15. The apparatus of claim 14, further comprising a component code decoder, wherein the component code decoder is configured to output the information related to the at least one possible error location.

16. The apparatus of claim 14, wherein the processor is further configured to stop decoding the plurality of component codes when an established termination condition is satisfied.

17. The apparatus of claim 14, wherein the processor is further configured to correct the at least one possible error location, wherein correcting the at least one possible error location comprises:
- marking a set of component codes as unreliable based on the state information;
- locating at least one intersection point among the set of component codes marked as unreliable;
- changing the code symbols located at each of the at least one intersection point; and
- resuming the step of decoding the plurality of component codes.

18. A method for windowed decoding of forward error correction codes, the method comprising:
- decoding a plurality of component codes within a specified window; and
- analyzing the decoding of each of the plurality of component codes to generate an outcome, wherein analyzing the decoding of each of the plurality of component codes comprises:
  - estimating at least one possible error location;
  - storing information related to the at least one possible error location;
  - storing state information; and
  - updating the state information based on: information related to the generated outcome; a previous version of the state information; and one or more updating rules based on the bit position of the component codes in the specified window.

19. The method of claim 18, wherein updating the state information comprises using the information related to the outcome to change at least one symbol estimate and revert at least one previous change.

20. The method of claim 19, wherein updating the state information further comprises preventing a correction of at least one estimated error that coincides with a reliable code.

* * * * *